(12) United States Patent
Murakami et al.

(10) Patent No.: US 7,023,933 B2
(45) Date of Patent: Apr. 4, 2006

(54) RADIO COMMUNICATION APPARATUS

(75) Inventors: Yutaka Murakami, Yokohama (JP); Shinichiro Takabayashi, Kawasaki (JP); Katsuaki Abe, Kawasaki (JP); Masayuki Orihashi, Ichikawa (JP); Akihiko Matsuoka, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 864 days.

(21) Appl. No.: 09/978,662

(22) Filed: Oct. 18, 2001

(65) Prior Publication Data

US 2002/0126764 A1 Sep. 12, 2002

(30) Foreign Application Priority Data

| Oct. 20, 2000 | (JP) | ............................. 2000-320624 |
| Nov. 6, 2000 | (JP) | ............................. 2000-337114 |
| Feb. 27, 2001 | (JP) | ............................. 2001-051829 |
| Aug. 10, 2001 | (JP) | ............................. 2001-245052 |

(51) Int. Cl.
*H04L 27/04* (2006.01)
*H04L 23/02* (2006.01)

(52) U.S. Cl. ...................................... 375/295; 375/261
(58) Field of Classification Search ................ 375/262, 375/295, 316, 261; 370/352, 465; 455/9, 455/10, 127.1, 245.1, 308, 427

See application file for complete search history.

(56) References Cited

U.S. PATENT DOCUMENTS

| 5,748,678 | A | * | 5/1998 | Valentine et al. | ........... 375/297 |
| 5,805,581 | A | * | 9/1998 | Uchida et al. | ............... 370/335 |
| 5,982,813 | A | * | 11/1999 | Dutta et al. | .................. 375/219 |
| 6,182,264 | B1 | * | 1/2001 | Ott | ............................. 714/774 |
| 6,304,593 | B1 | * | 10/2001 | Alouini et al. | ............... 375/216 |
| 6,351,499 | B1 | * | 2/2002 | Paulraj et al. | ............... 375/267 |
| 6,452,964 | B1 | * | 9/2002 | Yoshida | ....................... 375/222 |
| 6,496,543 | B1 | * | 12/2002 | Zehavi | ......................... 375/295 |
| 6,608,868 | B1 | * | 8/2003 | Murakami et al. | ........... 375/261 |
| 6,728,307 | B1 | * | 4/2004 | Derryberry et al. | ......... 375/219 |
| 6,735,245 | B1 | * | 5/2004 | Palm | ............................ 375/222 |
| 6,738,430 | B1 | * | 5/2004 | Murakami et al. | ........... 375/261 |
| 6,748,021 | B1 | * | 6/2004 | Daly | ............................ 375/261 |
| 6,760,882 | B1 | * | 7/2004 | Gesbert et al. | .............. 714/774 |
| 2002/0058505 | A1 | * | 5/2002 | Kim et al. | .................... 455/427 |
| 2002/0142732 | A1 | * | 10/2002 | Asano | .......................... 455/73 |
| 2003/0165157 | A1 | * | 9/2003 | Pollmann et al. | ............ 370/465 |

FOREIGN PATENT DOCUMENTS

| CN | 1222796 | 7/1999 |
| EP | 0878924 | 11/1998 |

(Continued)

OTHER PUBLICATIONS

English Language Abstract of JP 8-274756.

(Continued)

*Primary Examiner*—Emmanuel Bayard
*Assistant Examiner*—Lawrence B. Williams
(74) *Attorney, Agent, or Firm*—Greenblum & Bernstein, P.L.C.

(57) ABSTRACT

In a radio communication method whereby adaptive modulation is performed, a method is used whereby pilot symbol signal points are arranged in the in-phase-quadrature plane (IQ plane) so that the reception sensitivity of a receiving apparatus is made optimal in the respective modulation methods while maintaining the average transmission output power of the transmitting apparatus at a fixed level. By this means, it is possible to arrange pilot symbol signal points and improve the reception sensitivity characteristics of a receiving apparatus while maintaining the average transmission output power of the transmitting apparatus at a fixed level.

2 Claims, 33 Drawing Sheets

FOREIGN PATENT DOCUMENTS

| | | |
|---|---|---|
| JP | 57155856 | 9/1982 |
| JP | 57159148 | 10/1982 |
| JP | 05-304544 | 11/1993 |
| JP | 8-274756 | 10/1996 |
| JP | 08-274756 | 10/1996 |
| JP | 09-116589 | 5/1997 |
| JP | 9-200282 | 7/1997 |

OTHER PUBLICATIONS

SAMPEI, Rayleigh Fading Compensation Method for 16QAM MODEM in Digital Land Mobile Radio Systems, Transactions of the Institute of Electronics, Information and Communication Engineers B-II vol. J-72-B-II No. 1 pp. 7-15 Jan. 1989, along with an English Language translation.

English language translation of paragraph [0015] of JP 9-200282.

English language abstract of JP 57-155856.

English language abstract of JP 57-159148.

English language Abstract of JP 09-116589.

English language Abstract of JP 05-304544.

\* cited by examiner

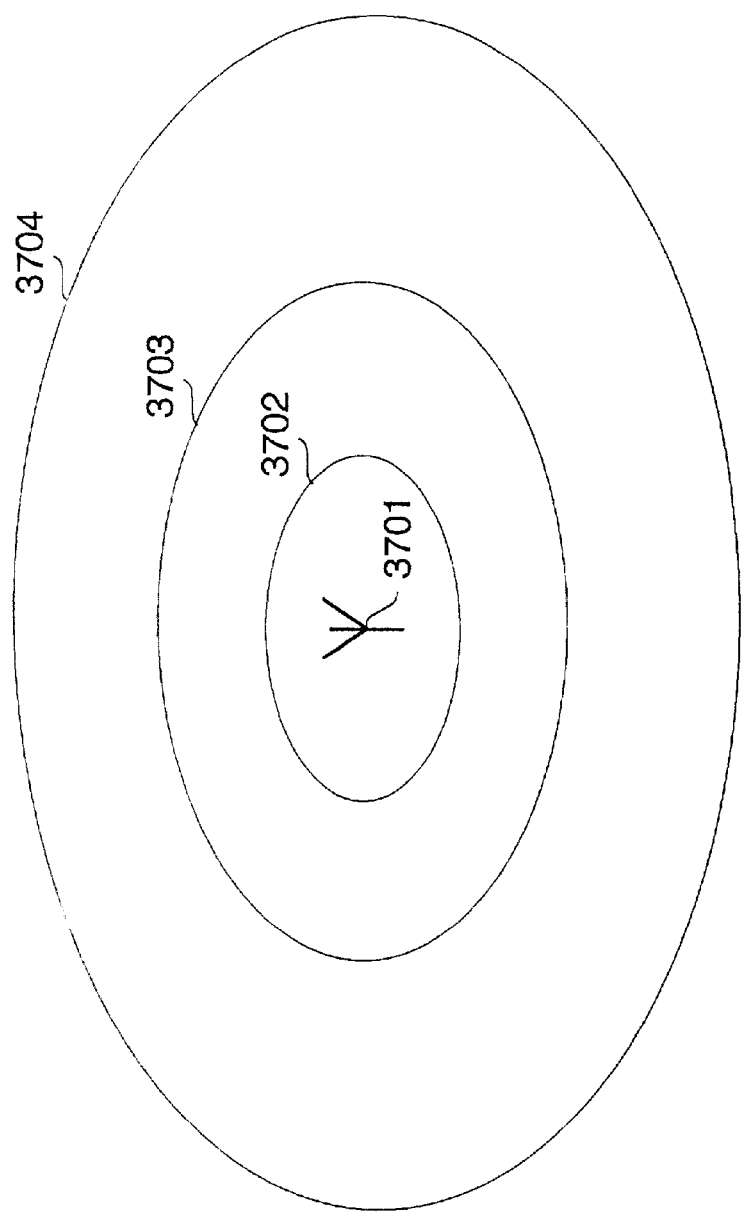

RADIO COMMUNICATION APPARATUS

BACKGROUND OF THE INVENTION

1. Field of the Invention

The present invention relates to a digital modulation method for use in radio communications.

2. Description of the Related Art

In a digital mobile radio communication method, transmission and reception between a base station apparatus and communication terminal apparatus is influenced by the radio wave propagation environment, and the radio wave propagation environment influences reception quality and reception sensitivity characteristics on the receiving side. In this regard, heretofore, a method relating to the pilot symbol signal point position when performing quasi-coherent detection has been presented in the document, Rayleigh Fading Compensation Method for 16QAM MODEM in Digital Land Mobile Radio Systems, SAMPEI, Transactions of the Institute of Electronics, Information and Communication Engineers B-II Vol. J-72-B-II No. 1 pp. 7–15 January 1989 as a method of improving the reception sensitivity characteristics of a receiving apparatus by devising a pilot symbol signal point position. FIG. 1 shows the signal point arrangement of 16QAM symbols and pilot symbols in the in-phase-quadrature plane (IQ plane). In FIG. 1, reference code 3501 indicates a 16QAM signal point in the IQ plane, and a method is known whereby the signal point that has the greatest amplitude among 16QAM signal points is taken as a pilot signal such that a pilot symbol signal point is placed at one of reference code 2402, reference code 2403, reference code 2404, and reference code 2405, and quasi-coherent detection is performed.

However, with conventional pilot symbol arrangement, a signal point with the greatest signal point amplitude of signal points in one modulation method is taken as a pilot symbol signal point, but when the reception sensitivity of the receiving apparatus is considered, this point is not necessarily at the optimum position for a pilot symbol signal point. Also, increasing the transmission power of the transmitting apparatus to improve the reception sensitivity characteristics of the receiving apparatus, and increasing the maximum signal amplitude shown in FIG. 1, means increasing the transmission power for all symbols to be transmitted, and thus increasing the power consumption of the transmitting apparatus.

However, with conventional pilot symbol arrangement, a signal point with the greatest signal point amplitude of signal points in one modulation method is taken as a pilot symbol signal point, but when the reception sensitivity of the receiving apparatus is considered, this point is not necessarily at the optimum position for a pilot symbol signal point. Also, increasing the transmission power of the transmitting apparatus to improve the reception sensitivity characteristics of the receiving apparatus, and increasing the maximum signal amplitude shown in FIG. 1, means increasing the transmission power for all symbols to be transmitted, and thus increasing the power consumption of the transmitting apparatus.

SUMMARY OF THE INVENTION

It is an objective of the present invention to arrange pilot symbol signal points while maintaining the average transmission power of a transmitting apparatus at a fixed level, and to improve the reception sensitivity characteristics of a receiving apparatus.

The present invention achieves the above objective by using a method whereby pilot symbol signal points are arranged in the in-phase-quadrature plane (IQ plane) so that the reception sensitivity of a receiving apparatus becomes optimal.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which;

FIG. 37 is a conceptual diagram showing the range in which communication from a base station is possible for each modulation method.

DETAILED DESCRIPTION OF THE PREFERRED EMBODIMENTS

With reference now to the attached drawings, embodiments of the present invention will be explained in detail below.

(Embodiment 1)

Figure 2:
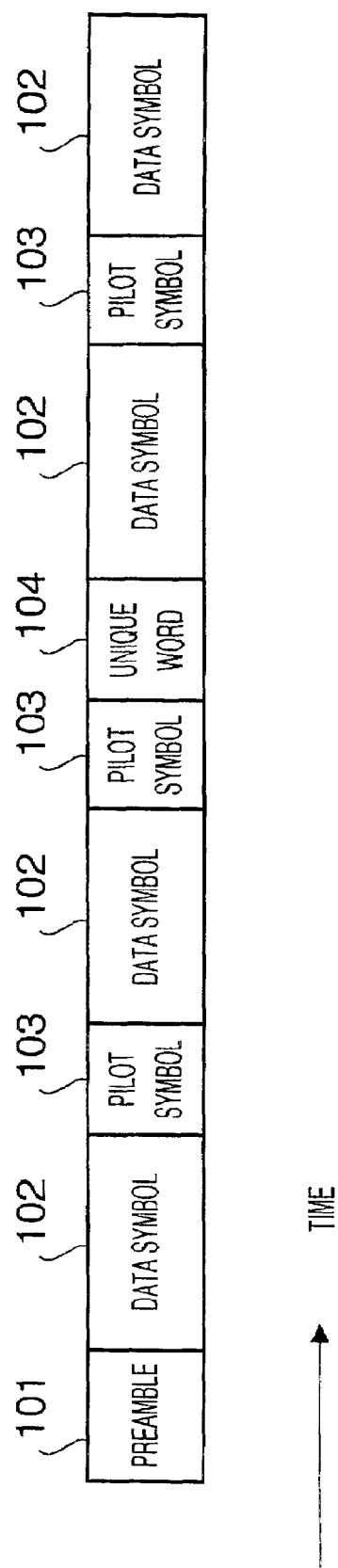
FIG. 2 is a drawing showing an example of a frame configuration according to Embodiment 1 of the present invention.

FIG. 2 shows an example of a frame configuration according to this embodiment. Modulation methods are explained below, taking a combination of three kinds—QPSK, 16QAM, and 64QAM—as an example.

In FIG. 2, a preamble 101, pilot symbols 103, and a unique word 104, are control information, and the preamble 101 includes information on the selected modulation method, including information indicating QPSK, 16QAM, or 64QAM. Data symbols 102 contain data information. The pilot symbols 103 are used to perform estimation of the radio wave propagation environment and coherent detection, and the unique word 104 is a signal for having the receiving apparatus achieve time synchronization with the transmitting apparatus. These items of control information require greater reliability than data symbols.

Figure 3:
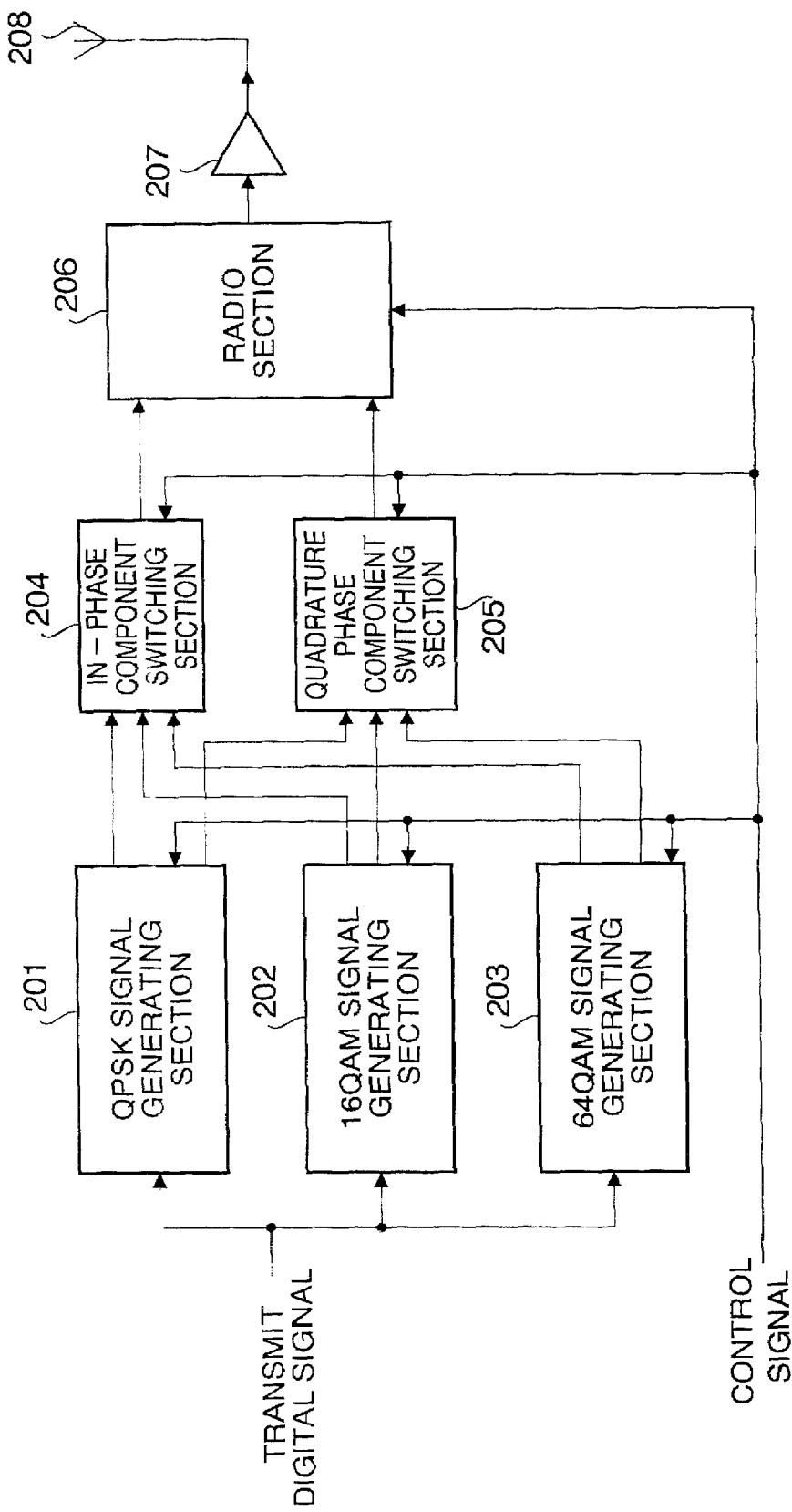
FIG. 3 is a block diagram showing the configuration of a transmitting apparatus according to Embodiment 1 of the present invention.

FIG. 3 shows the configuration of a transmitting apparatus according to this embodiment. In FIG. 3, in a QPSK signal generating section 201, when the modulation method information included in a control signal among the input transmit digital signals and control signals is QPSK, a quadrature baseband signal is generated in accordance with the frame configuration in FIG. 1, the in-phase component of the QPSK quadrature baseband signal is output to an in-phase component switching section 204, and the quadrature phase component of the QPSK quadrature baseband signal is output to a quadrature phase component switching section 205.

Figure 1:
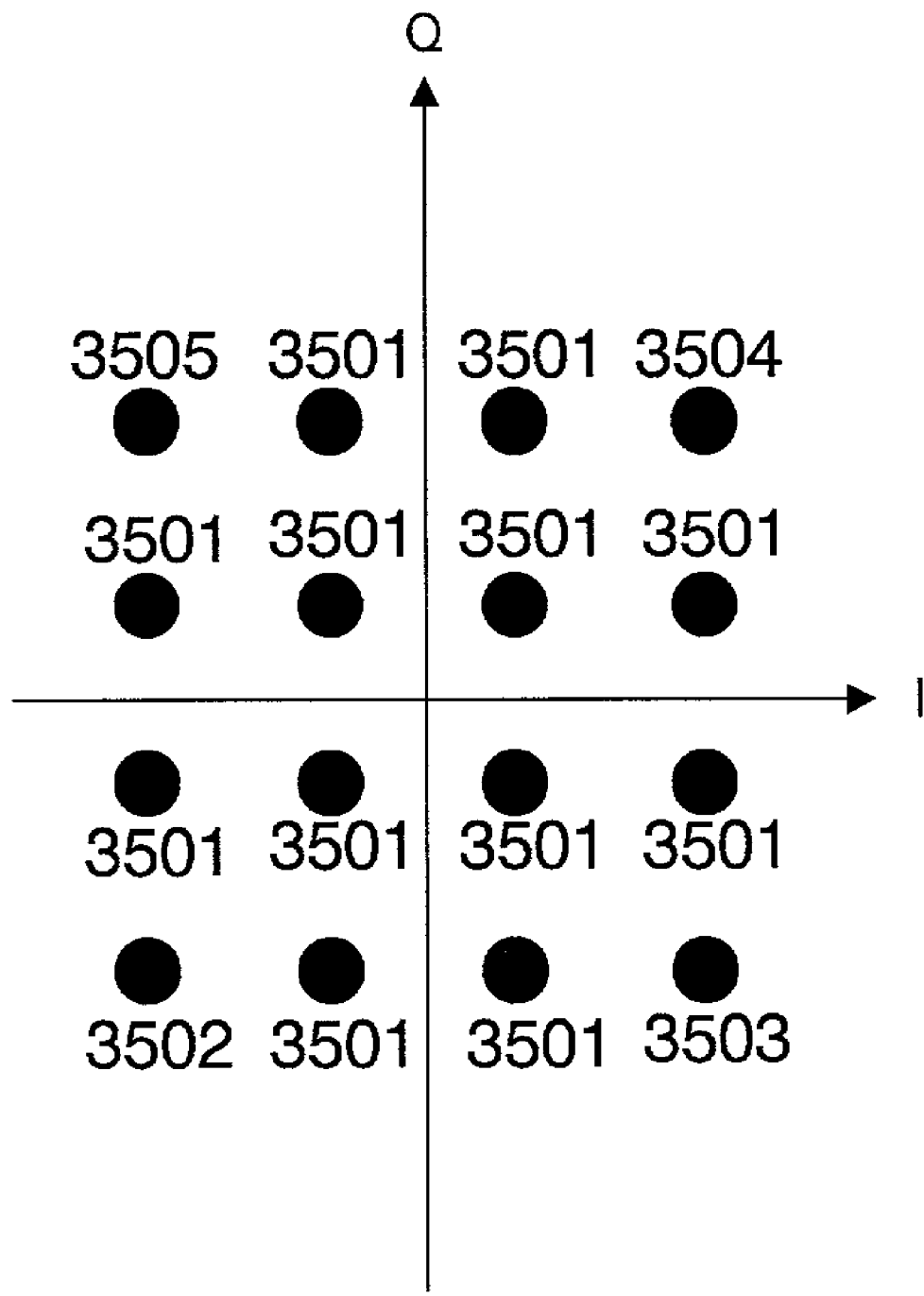
FIG. 1 is a drawing showing 16QAM symbol and pilot symbol signal point arrangement in the IQ plane.

In a 16QAM signal generating section 202, when the modulation method information included in a control signal among the input transmit digital signals and control signals is 16QAM, a quadrature baseband signal is generated in accordance with the frame configuration in FIG. 1, the in-phase component of the 16QAM quadrature baseband signal is output to the in-phase component switching section 204, and the quadrature phase component of the 16QAM quadrature baseband signal is output to the quadrature phase component switching section 205.

In a 64QAM signal generating section 203, when the modulation method information included in a control signal among the input transmit digital signals and control signals is 64QAM, a quadrature baseband signal is generated in accordance with the frame configuration in FIG. 1, the in-phase component of the 64QAM quadrature baseband signal is output to the in-phase component switching section 204, and the quadrature phase component of the 64QAM quadrature baseband signal is output to the quadrature phase component switching section 205.

The in-phase component switching section 204 switches the input part, based on the quadrature baseband signal in-phase component input by the QPSK signal generating section 201, 16QAM signal generating section 202, or 64QAM signal generating section 203, and modulation method information contained in a control signal among control signals input according to a separate rate, so that the quadrature baseband signal in-phase component of the specified modulation method is input, and outputs the input quadrature baseband signal in-phase component to a radio section 206.

The quadrature phase component switching section 205 switches the input part, based on the quadrature baseband signal in-phase component input by the QPSK signal generating section 201, 16QAM signal generating section 202, or 64QAM signal generating section 203, and modulation method information contained in a control signal among control signals input according to a separate rate, so that the transmit quadrature baseband signal quadrature phase component of the specified modulation method is input, and outputs the input quadrature baseband signal quadrature phase component to the radio section 206.

The radio section 206 performs predetermined radio processing on the transmit quadrature baseband signal in-phase component output from the in-phase component switching section 204 and the transmit quadrature baseband signal quadrature phase component output from the quadrature phase component switching section 205, and outputs the result to a transmission power amplification section 207. The transmission power amplification section 207 amplifies the signal that has undergone radio processing by the radio section 206, and transmits the amplified transmit signal via a transmit antenna 208.

Figure 4:
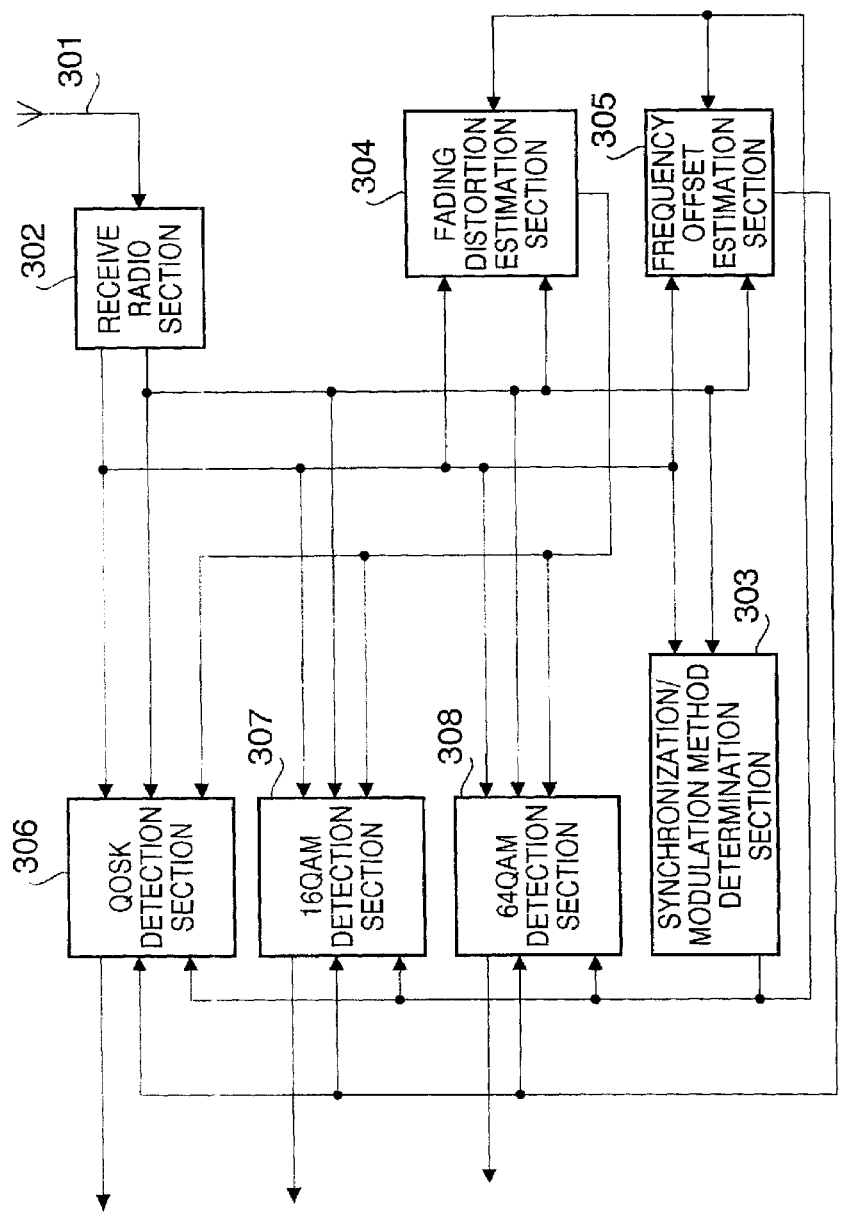
FIG. 4 is a block diagram showing the configuration of a receiving apparatus according to Embodiment 1 of the present invention.

FIG. 4 shows the configuration of a receiving apparatus according to this embodiment. In FIG. 4, a receive radio section 302 performs predetermined radio processing on a signal received via a receive antenna 301 (received signal), and outputs the received quadrature baseband signal in-phase component and received quadrature baseband signal quadrature phase component to a synchronization/modulation method determination section 303, fading distortion estimation section 304, frequency offset estimation section 305, QPSK detection section 306, 16QAM detection section 307, and 64QAM detection section 308.

The synchronization/modulation method determination section 303 detects the unique word in FIG. 2 from the received quadrature baseband signal in-phase component and received quadrature baseband signal quadrature phase component output from the receive radio section 302, and achieves time synchronization with the transmitting apparatus based on the detected unique word. In addition, the synchronization/modulation method determination section 303 detects the preamble and identifies modulation method information contained in the preamble. A control signal containing these two items of information is output to the QPSK detection section 306, 16QAM detection section 307, and 64QAM detection section 308.

The fading distortion estimation section 304 estimates distortion due to fading from the pilot symbol in FIG. 2 using the received quadrature baseband signal in-phase component and received quadrature baseband signal quadrature phase component output from the receive radio section 302, and a control signal output from the synchronization/modulation method determination section 303, and outputs a fading distortion estimation signal to the QPSK detection section 306, 16QAM detection section 307, and 64QAM detection section 308.

The frequency offset estimation section 305 estimates the frequency offset from the pilot symbol in FIG. 2 using the received quadrature baseband signal in-phase component and quadrature phase component output from the receive radio section 302, and a control signal output from the synchronization/modulation method determination section 303, and outputs a frequency offset estimation signal to the QPSK detection section 306, 16QAM detection section 307, and 64QAM detection section 308.

When modulation method information contained in the control signal output from the synchronization/modulation method determination section 303 indicates QPSK, the QPSK detection section 306 performs elimination and demodulation of fading distortion and frequency offset in the received quadrature baseband signal in-phase component and received quadrature baseband signal quadrature phase component output from the receive radio section 302, using the fading distortion estimation signal output from the fading distortion estimation section 304 and the frequency offset estimation signal output from the frequency offset estimation section 305, and outputs a QPSK received digital signal.

When modulation method information contained in the control signal output from the synchronization/modulation method determination section 303 indicates 16QAM, the 16QAM detection section 307 performs elimination and demodulation of fading distortion and frequency offset in the received quadrature baseband signal in-phase component and received quadrature baseband signal quadrature phase component output from the receive radio section 302, using the fading distortion estimation signal output from the fading distortion estimation section 304 and the frequency offset estimation signal output from the frequency offset estimation section 305, and outputs a 16QAM received digital signal.

When modulation method information contained in the control signal output from the synchronization/modulation method determination section 303 indicates 64QAM, the 64QAM detection section 308 performs elimination and demodulation of fading distortion and frequency offset in the received quadrature baseband signal in-phase component and received quadrature baseband signal quadrature phase component output from the receive radio section 302, using the fading distortion estimation signal output from the fading distortion estimation section 304 and the frequency offset estimation signal output from the frequency offset estimation section 305, and outputs a 64QAM received digital signal.

Next, the operation of a transmitting apparatus and receiving apparatus that have the above-described configuration will be described. First, the transmit digital signal and control signal shown in FIG. 3 are input to the QPSK signal generating section 201, 16QAM signal generating section 202, and 64QAM signal generating section 203, only the signal generating section that matches the modulation method information of the control signal is operated, and by means of the signal generating section for the relevant modulation method, a quadrature baseband signal is generated, the quadrature baseband signal in-phase component is output to the in-phase component switching section 204, and the quadrature baseband signal quadrature phase component is output to the quadrature phase component switching section 205.

The quadrature baseband signal in-phase component output from the modulation method determination section is switched to the input section corresponding to the modulation method indicated by the control signal by the in-phase component switching section 204, and is output to the radio section 206. Also, the quadrature baseband signal quadrature phase component output from the modulation method determination section is switched to the input section corresponding to the modulation method indicated by the control signal by the quadrature phase component switching section 205, and is output to the radio section 206.

The transmit quadrature baseband signal in-phase component output from the in-phase component switching section 204 and the transmit quadrature baseband signal quadrature phase component output from the quadrature phase component switching section 205 undergo predetermined radio processing by the radio section 206, and a transmit signal is output to the transmission power amplification section 207. The transmit signal output from the radio section 206 undergoes power amplification by the amplification section 207, and is transmitted to the receiving apparatus via the transmit antenna 208.

The signal transmitted by the transmitting apparatus is received by the receiving apparatus via the antenna 301 shown in FIG. 4. In FIG. 4, the signal received via the antenna 301 (received signal) undergoes predetermined radio processing by the receive radio section 302, and the received quadrature baseband signal in-phase component and received quadrature baseband signal quadrature phase component are output to the synchronization/modulation method determination section 303, fading distortion estimation section 304, frequency offset estimation section 305, QPSK detection section 306, 16QAM detection section 307, and 64QAM detection section 308.

For the received quadrature baseband signal in-phase component and received quadrature baseband signal quadrature phase component output from the receive radio section 302, the unique word shown in FIG. 2 is detected by the synchronization/modulation method determination section 303, and time synchronization with the transmitting apparatus is achieved based on the detected unique word. In addition, the preamble is detected and modulation method information contained in the preamble is identified. A control signal containing these two items of information is generated, and is output to the fading distortion estimation section 304, frequency offset estimation section 305, QPSK detection section 306, 16QAM detection section 307, and 64QAM detection section 308.

For the received quadrature baseband signal in-phase component and received quadrature baseband signal quadrature phase component output from the receive radio section 302, and a control signal output from the synchronization/modulation method determination section 303, distortion due to fading is estimated from the pilot symbol shown in FIG. 2 by the fading distortion estimation section 304, and a fading distortion estimation signal is output to the QPSK detection section 306, 16QAM detection section 307, and 64QAM detection section 308.

Also, for the received quadrature baseband signal in-phase component and received quadrature baseband signal quadrature phase component output from the receive radio section 302, and a control signal output from the synchronization/modulation method determination section 303, a frequency offset is estimated from the pilot symbol shown in FIG. 2 by the frequency offset estimation section 305, and a frequency offset estimation signal is output to the QPSK detection section 306, 16QAM detection section 307, and 64QAM detection section 308.

The detection section corresponding to the modulation method information of the control signal output from the synchronization/modulation method determination section 303—that is, the QPSK detection section 306, 16QAM detection section 307, or 64QAM detection section 308—performs elimination and demodulation of fading distortion and frequency offset in the received quadrature baseband signal in-phase component and quadrature phase component output from the receive radio section 302, using the fading distortion estimation signal output from the fading distortion estimation section 304 and the frequency offset estimation signal output from the frequency offset estimation section 305, and outputs a received digital signal according to the respective modulation method.

The operation of a transmission power amplification section in a radio communication system of this embodiment, and pilot symbol signal point arrangement in each modulation method, will now be described. In this embodiment, the pilot symbol signal point amplitude indicates transmission power in the IQ plane, and when transmission power is raised the pilot symbol signal point amplitude increases.

Figure 5:
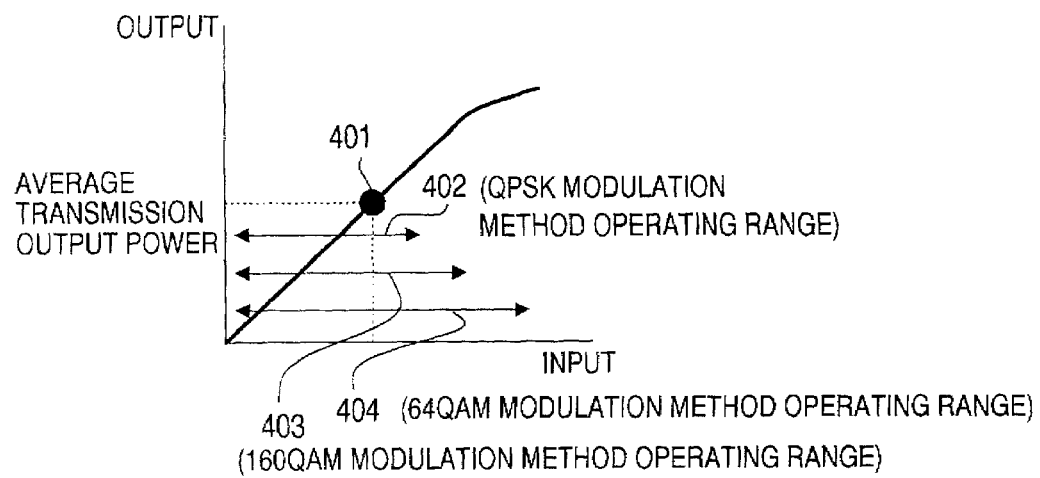
FIG. 5 is an input/output relationship diagram of a conventional transmission power amplification section.

FIG. 5 shows the input/output relationship of a conventional transmission power amplification section. In FIG. 5, reference code 401 denotes the operation point of the transmission power amplification section, indicating the average transmission output power. Reference code 402, reference code 403, and reference code 404 denote the QPSK, 16QAM, and 64QAM operating ranges (level ranges in which input of a signal to be input to the power amplification section is possible), respectively, and show the transmission power amplification section operating range when the respective modulation method is selected. As shown in FIG. 5, the operating range is greatest when the modulation method is 64QAM. Thus, conventionally, the operating range is determined by the modulation method.

However, since the transmission power amplification section uses a transmission power amplifier capable of linear amplification of a 16QAM modulation method signal, when the modulation method is QPSK or 16QAM, linear amplification is possible even if the operating range is extended within a range in which the operating range does not exceed the 64QAM operating range.

Thus, with a radio communication method that performs adaptive modulation according to this embodiment, a method is used whereby pilot symbol signal points are arranged in the IQ plane so that the reception sensitivity characteristics of the receiving apparatus are most improved within a range in which the greatest operating range of the transmission power amplifier does not exceed a wide modulation method operating range. That is to say, when the modulation method is QPSK or 16QAM, the pilot symbol input level is increased in a range in which the operating range does not exceed the 64QAM operating range, and the reception sensitivity characteristics of the receiving apparatus are improved. This method will be described below.

Figure 6:
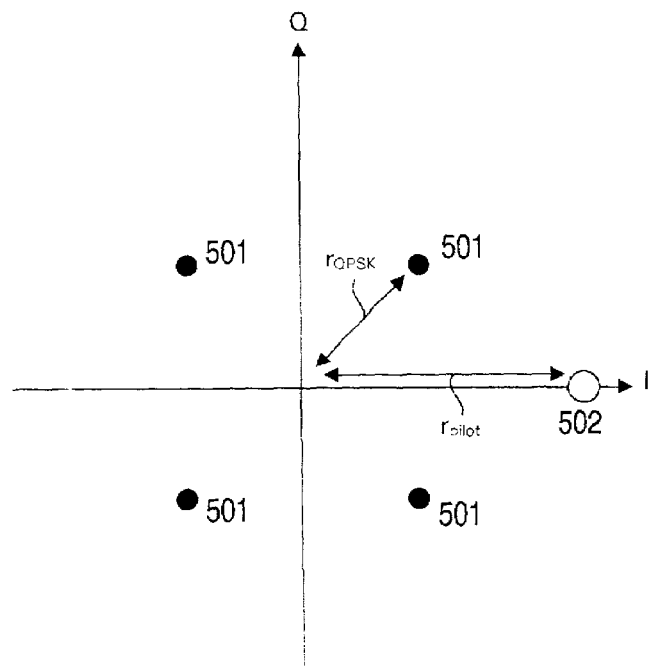
FIG. 6 is a drawing showing QPSK symbol and pilot symbol signal point arrangement in the IQ plane according to Embodiment 1 of the present invention.

FIG. 6 shows QPSK symbol and pilot symbol signal point arrangement in the IQ plane according to this embodiment. Reference code 501 denotes a QPSK modulation signal point and reference code 502 denotes the pilot symbol signal point. If the pilot symbol signal point amplification is designated $r_{pilot}$, as $r_{pilot}$ is increased resistance to pilot symbol noise is strengthened in the receiving apparatus, the accuracy of fading distortion estimation by the fading distortion estimation section 304 and the accuracy of estimation by the frequency offset estimation section 305 in the receiving apparatus in FIG. 4 is improved, and high-precision detection processing can be carried out, with the result that the reception sensitivity characteristics of the receiving apparatus are improved.

Figure 7:
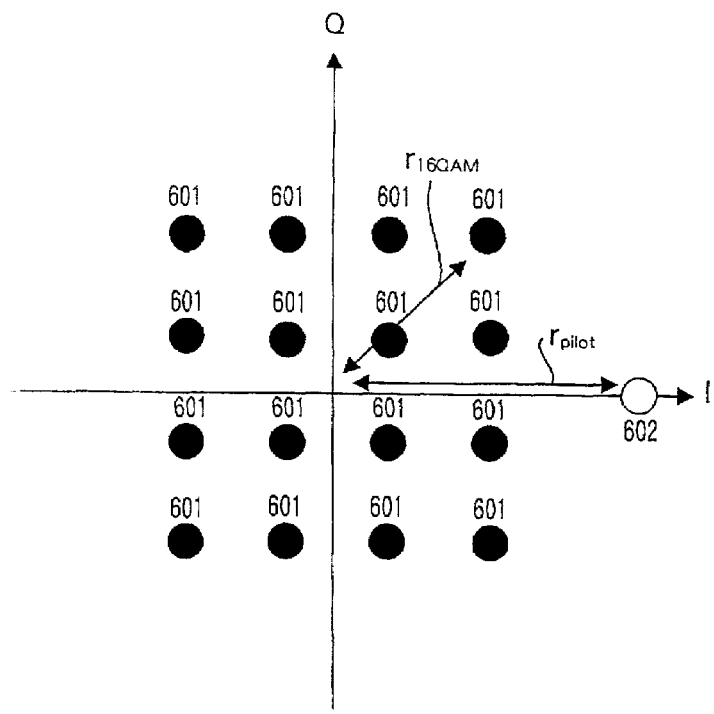
FIG. 7 is a drawing showing 16QAM symbol and pilot symbol signal point arrangement in the IQ plane according to Embodiment 1 of the present invention.

Further, FIG. 7 shows 16QAM symbol and pilot symbol signal point arrangement in the IQ plane according to this embodiment. Reference code 601 denotes a 16QAM signal point and reference code 602 denotes the pilot symbol signal point. If the pilot symbol signal point amplification is designated $r_{pilot}$, as $r_{pilot}$ is increased resistance to pilot symbol noise is strengthened in the receiving apparatus, the accuracy of fading distortion estimation by the fading distortion estimation section 304 and the accuracy of estimation by the frequency offset estimation section 305 in the receiving apparatus in FIG. 4 is improved, and high-precision detection processing can be carried out, with the result that the reception sensitivity characteristics of the receiving apparatus are improved. The same also applies to 64QAM.

Figure 8:
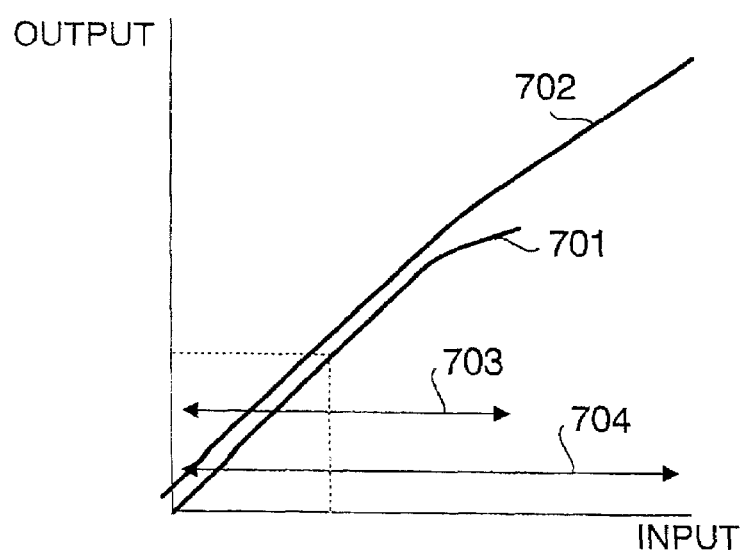
FIG. 8 is an input/output relationship diagram of two kinds of transmission power amplification sections according to Embodiment 1 of the present invention.

Next, the operating ranges of two kinds of transmission power amplification sections with different input/output characteristics will be described. FIG. 8 shows the input/output relationship of two kinds of transmission power amplification sections according to this embodiment. In order to attempt a general description, the two kinds of transmission power amplification sections are here designated transmission power amplification section A and transmission power amplification section B. In FIG. 8, reference code 701 indicates the input/output relationship of transmission power amplification section A, and reference code 702 indicates the input/output relationship of transmission power amplification section B. When the input level is in the operating range indicated by reference code 703, it can be handled by either transmission power amplification section A or transmission power amplification section B. However, when the input level is in the operating range indicated by reference code 704, there is a range that cannot be handled by transmission power amplification section A. For example, to consider a communication apparatus for which use of a modulation method up to 16QAM is sufficient, assuming that input can be handled by use of a transmission power amplifier that has the input/output characteristic indicated by reference code 701, power consumption can be kept lower than when using a transmission power amplifier that has the input/output characteristic indicated by reference code 702. However, assuming that a transmission power amplifier indicated by reference code 702 must be used in order to handle 64QAM used in this embodiment, it is possible to secure a wider operating range than the operating range indicated by reference code 703. That is to say, when a QPSK or 16QAM modulation method is used, if the pilot symbol transmission power is increased in the operating range indicated by reference code 704, the accuracy of fading distortion estimation and frequency offset estimation in the receiving apparatus increases, and the reception sensitivity characteristics of the receiving apparatus improve.

In this embodiment, the greatest operating range of the transmission power amplification section is the 64QAM operating range. Therefore, as a result of making $r_{pilot}$ larger than $r_{QPSK}$, the operating range in the transmission power amplification section is increased, but as long as the range is within the 64QAM method operating range, amplification is still possible when QPSK is selected. The same can be assumed when 16QAM is used.

Figure 9:
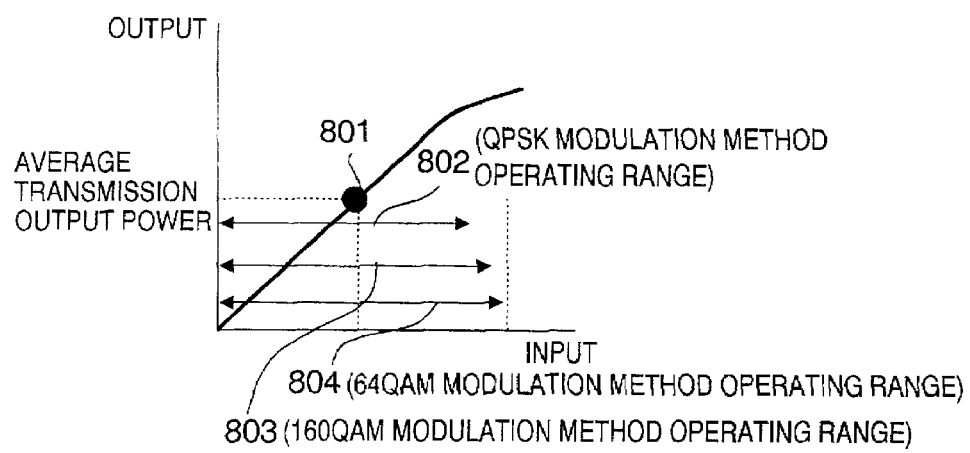
FIG. 9 is an input/output relationship diagram of a transmission power amplification section according to Embodiment 1 of the present invention.

Taking the above into consideration, it becomes possible to arrive at the kind of transmission power amplification section input/output relationship shown in FIG. 9. FIG. 9 is a graph showing the input/output relationship of a transmission power amplification section according to this embodiment, in which reference code 801 denotes the operation point of the transmission power amplification section, reference code 802 denotes the QPSK operating range when the pilot symbol signal point amplitude is made greater than the maximum signal point amplitude in conventional QPSK modulation, reference code 803 denotes the 16QAM operating range when the pilot symbol signal point amplitude is made greater than the 16QAM maximum signal point amplitude, and reference code 804 denotes the 64QAM method operating range. Note that the operating range denoted by reference code 802 and the operating range denoted by reference code 803 are taken to be smaller than the 64QAM operating range. At this time, the QPSK operating range and 16QAM operating range in FIG. 9 are greater than when a transmission power amplification section is used as shown in FIG. 5, but amplification is possible and it is also possible to set the operating range of each modulation method as the same range. Meanwhile, in the receiving apparatus, when QPSK or 16QAM is used, resistance to pilot symbol noise is strengthened. However, it is not necessarily the case that the pilot symbol amplitude need only be increased, and the fact that there is an optimum amplitude will now be explained using FIG. 10.

Figure 10:
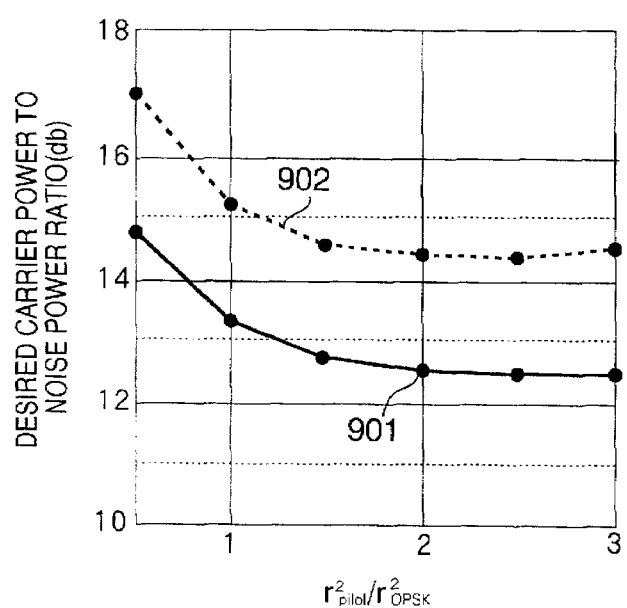
FIG. 10 is a graph of the power ratio of a QPSK modulation pilot symbol and signal point according to Embodiment 1 of the present invention vs. the desired carrier power to noise power ratio necessary for bit error rates of $10^{-4}$ and $10^{-6}$.

FIG. 10 shows a graph of the power ratio of a QPSK modulation pilot symbol and signal point according to this embodiment vs. the desired carrier power to noise power ratio necessary for bit error rates of $10^{-4}$ and $10^{-6}$. Reference code 901 indicates the desired carrier power to noise power ratio necessary for a bit error rate of $10^{-4}$, and reference code 902 indicates the desired carrier power to noise power ratio necessary for a bit error rate of $10^{-6}$. Looking at reference code 901, on the horizontal axis of lowest values of the desired carrier power to noise power ratio at a bit error rate of $10^{-4}$ ($r^2_{pilot}/r^2_{QPSK}$), the value is 2, and it is not the case that the desired carrier power to noise power ratio decreases even though the pilot signal amplitude increases. The same can be assumed in the case of a $10^{-6}$ bit error rate indicated by reference code 902, and it can be said that there is an optimum amplitude of the pilot signal.

With this embodiment, the description has been based on a single carrier method, but implementation is also possible in a similar way with a multiplexing method, CDMA method, or OFDM (Orthogonal Frequency Division Multiplexing) method.

Figure 11:
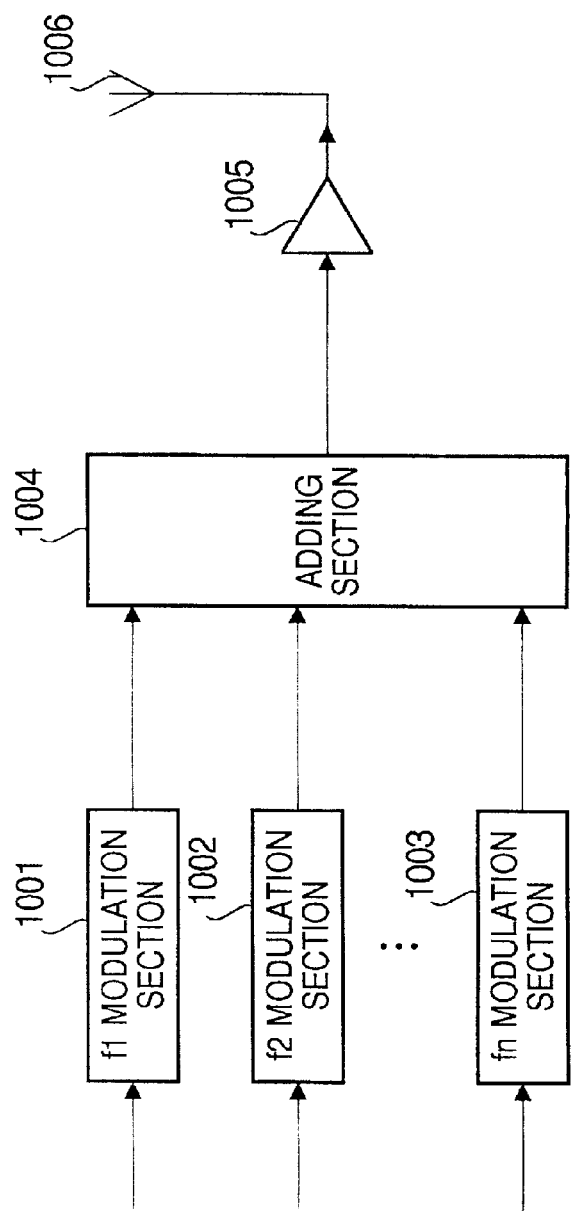
FIG. 11 is a block diagram showing the configuration of a transmitting apparatus that performs common amplification according to Embodiment 1 of the present invention.

The fact that this embodiment can also be applied in common amplification will now be explained below using FIG. 11. FIG. 11 shows the configuration of a transmitting apparatus that performs common amplification according to this embodiment. An f1 modulation section 1001 performs digital modulation of a frequency f1 digital signal, and outputs a frequency f1 transmit signal to an adding section 1004. An f2 modulation section 1002 performs digital modulation of a frequency f2 digital signal, and outputs a frequency f2 transmit signal to the adding section 1004. An fn modulation section 1003 performs digital modulation of a frequency fn digital signal, and outputs a frequency fn transmit signal to the adding section 1004.

The adding section 1004 adds the frequency f1 transmit signal, frequency f2 transmit signal, and frequency fn transmit signal, and outputs the transmit signal resulting from the addition to a transmission power amplification section 1005. The transmission power amplification section 1005 amplifies the transmit signal resulting from the addition and transmits the amplified transmit signal via a transmit antenna 1006.

According to the above-described embodiment, with a radio communication method that performs adaptive modulation, the reception sensitivity characteristics of a receiving apparatus can be improved by placing the pilot symbol signal point in the IQ plane so that the reception sensitivity of the receiving apparatus is made optimal, while maintaining the average transmission output power of the transmitting apparatus at a fixed level.

A combination of three kinds of modulation methods—QPSK, 16QAM, and 64QAM—has been taken as an example in the description, but this embodiment is not limited to these modulation methods, and moreover is not limited to switching between three modulation methods.

In this embodiment, a known signal point has been taken as an example for the pilot symbol in the description, but this is not a limitation, and a PSK modulation signal, for example, may also be used as a pilot symbol.

Also, in this embodiment, a pilot symbol is used in fading distortion estimation and frequency offset estimation in the receiving apparatus, but these can also be performed using other control information such as a preamble or unique word as shown in FIG. 2.

As regards control information, also, of which channel control information with data eliminated is an example, the same kind of implementation is possible as for a pilot symbol in this embodiment. At this time, control information is characterized in having greater error tolerance for noise compared with data in particular.

(Embodiment 2)

In Embodiment 2, a communication system modulation method determination method will be described whereby the modulation method is switched according to the radio wave propagation environment and the communication traffic in a radio communication system, transmitting apparatus, and receiving apparatus using the method described in Embodiment 1.

Figure 12:
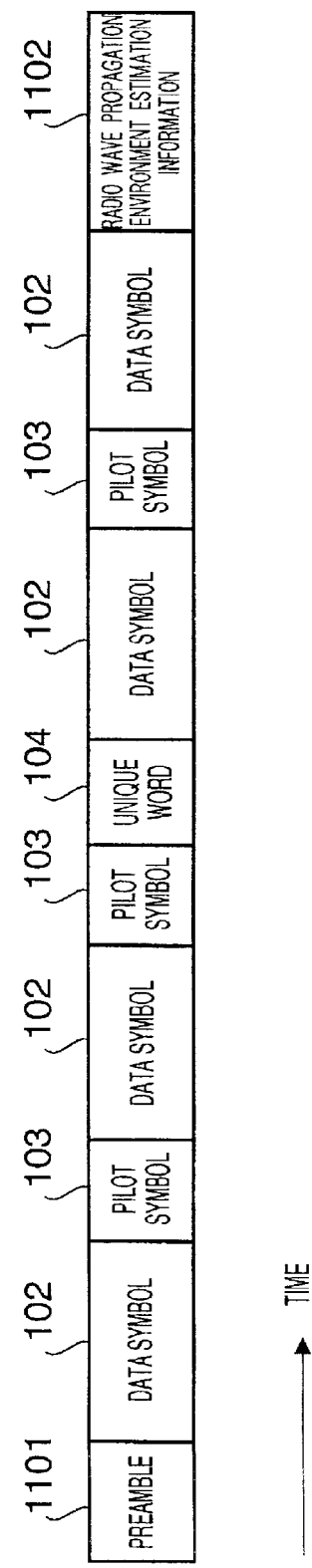
FIG. 12 is a drawing showing an example of the frame configuration of a signal transmitted by a communication terminal according to Embodiment 2 of the present invention.

FIG. 12 is a drawing showing an example of the frame configuration transmitted by a communication terminal according to this embodiment. The parts in FIG. 12 identical to those in FIG. 2 are assigned the same codes as in FIG. 2 and their detailed explanations are omitted. In FIG. 12, reference code 1101 denotes a preamble, containing control information. Reference code 1102 denotes radio wave propagation environment estimation information, being symbols whereby a communication terminal estimates the radio wave propagation environment of a signal transmitted by the base station, for notification to the base station as radio wave propagation environment information.

Figure 13:
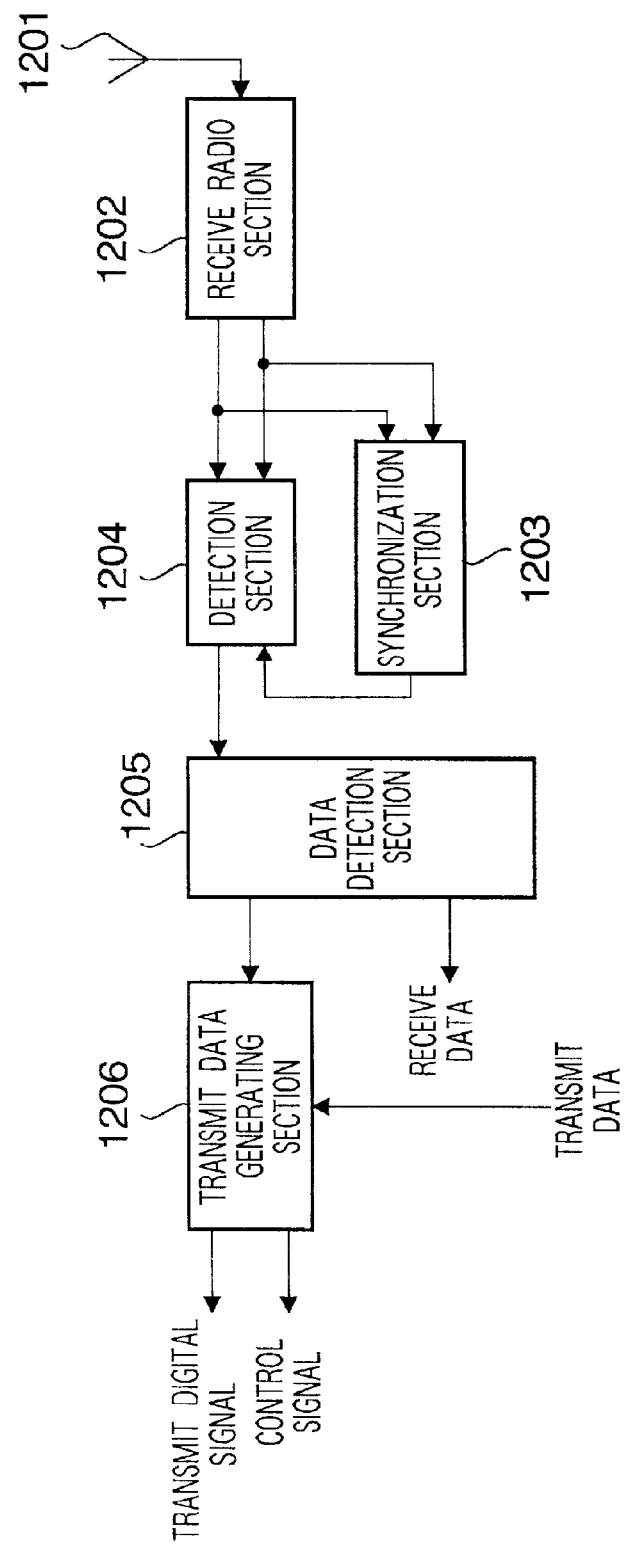
FIG. 13 is a block diagram showing the configuration of a receiving apparatus in a base station according to Embodiment 2 of the present invention.

Next the configuration of a base station receiving apparatus will be described. FIG. 13 shows the configuration of a base station receiving apparatus according to this embodiment. In FIG. 13, a receive radio section 1202 performs predetermined radio processing on a signal received via an antenna 1201 (received signal), and outputs the received quadrature baseband signal in-phase component and received quadrature baseband signal quadrature phase component to a synchronization section 1203 and detection section 1204.

The synchronization section 1203 detects the 304 unique word in FIG. 12 from the received quadrature baseband signal in-phase component and received quadrature baseband signal quadrature phase component output from the receive radio section 1202, achieves time synchronization with the communication terminal based on the detected unique word, and outputs a signal as a synchronization signal to the detection section 1204.

The detection section 1204 performs detection processing on a signal transmitted from the communication terminal according to the received quadrature baseband signal in-phase component and received quadrature baseband signal quadrature phase component output from the receive radio section 1202, and the synchronization signal output from the synchronization section 1203, and outputs a received digital signal to a data detection section 1205.

The data detection section 1205 outputs radio wave propagation environment information to a transmit data generating section 1206 from the received digital signal output from the detection section 1204 based on the frame configuration in FIG. 11, and outputs receive data.

The transmit data generating section 1206 determines the modulation method based on the radio wave propagation environment information from within the radio wave propagation environment information output from the data detection section 1205 and the input transmit data, and outputs a transmit digital signal that has information bits corresponding to the determined modulation method and a control signal notifying the base station of the determined modulation method. If it is determined by the data detection section 1205 that there is a plurality of arriving waves, other parameters indicating the radio wave propagation environment have no effect, and the transmit data generating section 1206 selects QPSK, which has good error tolerance, and issues a request to the communication terminal. This is done to prevent the reception of a plurality of arriving waves, since the receiving apparatus cannot perform signal demodulation in such a case.

Figure 14:
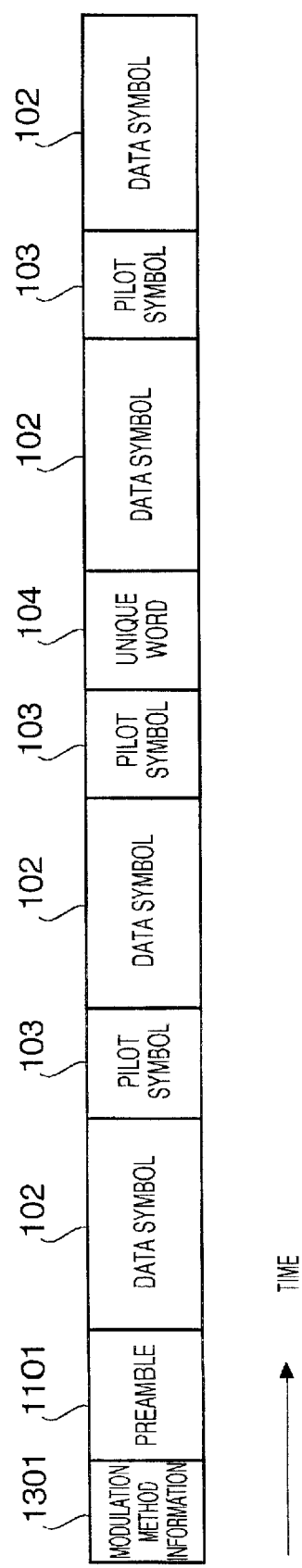
FIG. 14 is a drawing showing an example of the frame configuration of a signal transmitted by a base station according to Embodiment 2 of the present invention.

FIG. 14 shows an example of the frame configuration transmitted by a base station according to this embodiment. The parts in FIG. 14 identical to those in FIG. 12 are assigned the same codes as in FIG. 12 and their detailed explanations are omitted. In FIG. 14, reference code 1301 denotes modulation method information, being symbols for notifying the communication terminal of the modulation method of the base station.

Figure 15:
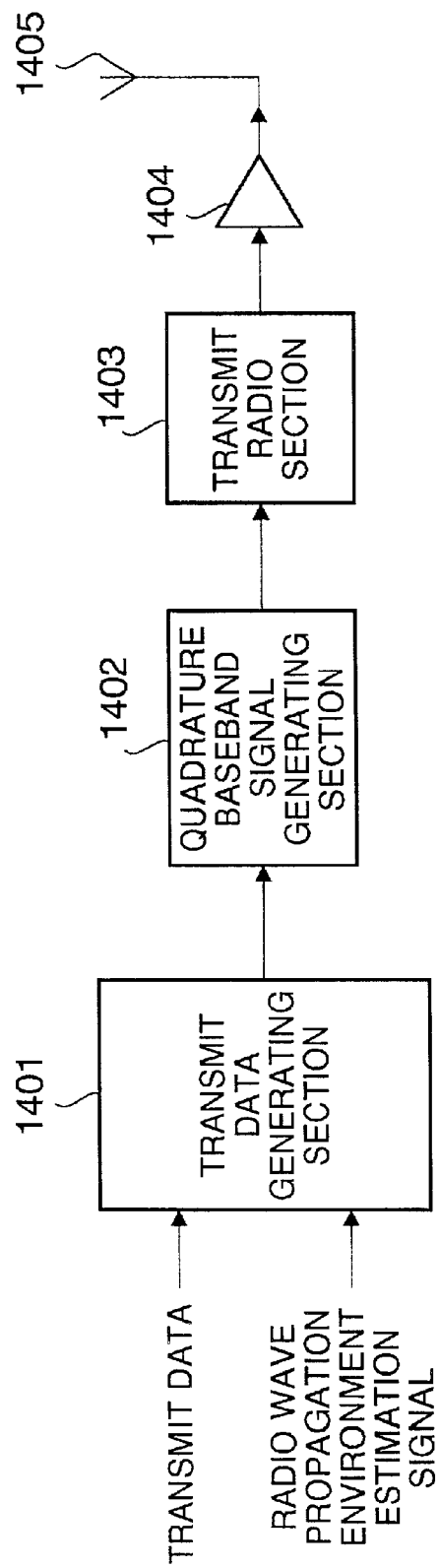
FIG. 15 is a block diagram showing the configuration of the transmitting apparatus of a communication terminal according to Embodiment 2 of the present invention.

Next, the configuration of the transmitting apparatus of a communication terminal apparatus will be described. FIG. 15 shows the configuration of the transmitting apparatus of a communication terminal according to this embodiment. In FIG. 15, a transmit data generating section 1401 generates a transmit digital signal in accordance with the frame configuration in FIG. 12 from transmit data and a radio wave propagation environment estimation signal, and outputs it to a quadrature baseband signal generating section 1402.

The quadrature baseband signal generating section 1402 generates a transmit quadrature baseband signal in-phase component and transmit quadrature baseband signal quadrature phase component from the transmit digital signal output from the transmit data generating section 1401, and outputs them to a transmit radio section 1403.

The transmit radio section 1403 performs predetermined radio processing on the transmit quadrature baseband signal in-phase component and transmit quadrature baseband signal quadrature phase component generated by the quadrature baseband signal generating section 1402, and outputs a transmit signal to a transmission power amplification section 1404. The transmission power amplification section 1404 amplifies the transmit signal output from the transmit radio section 1403 and outputs the amplified transmit signal to the base station via a transmit antenna 1405.

Figure 16:
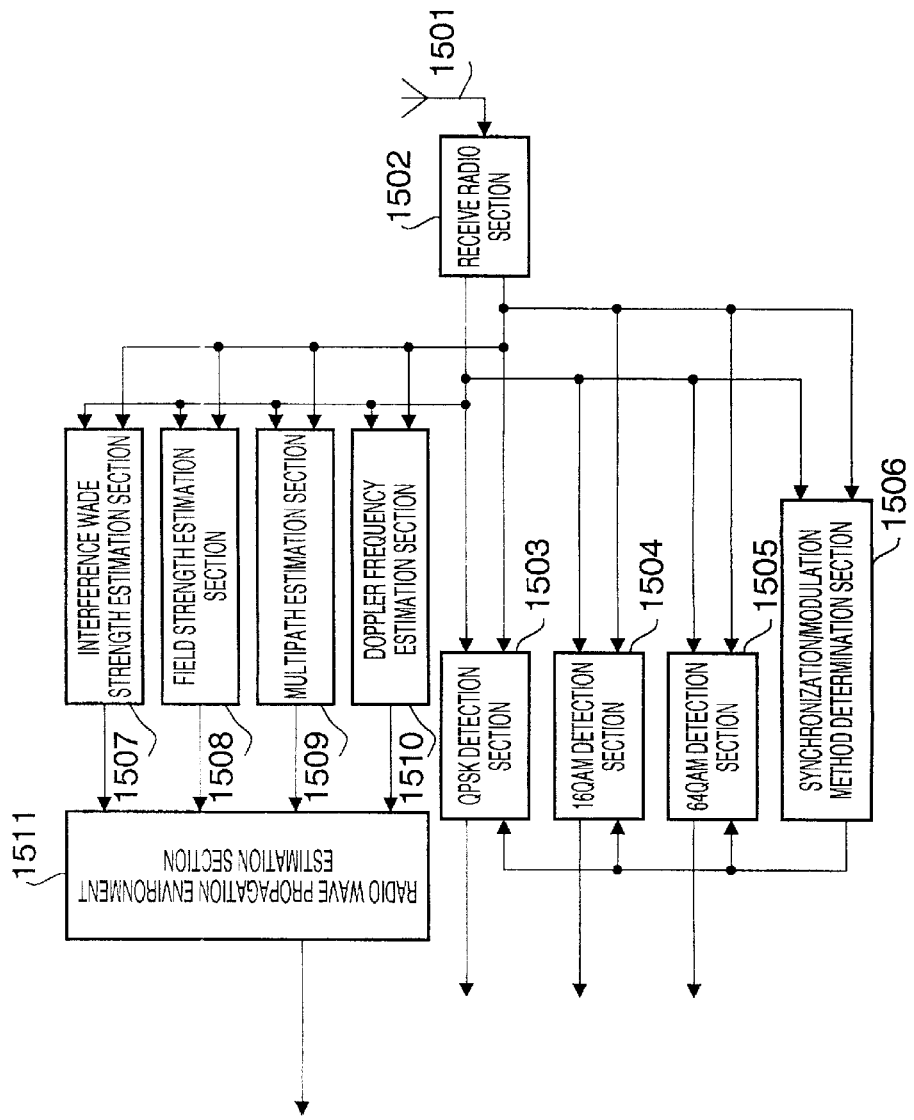
FIG. 16 is a block diagram showing the configuration of the receiving apparatus of a communication terminal according to Embodiment 2 of the present invention.

FIG. 16 shows the configuration of the receiving apparatus of a communication terminal according to this embodiment. In FIG. 16, a receive radio section 1502 performs predetermined radio reception processing on a signal received via a receive antenna 1501 (received signal), and outputs the received quadrature baseband signal in-phase component and received quadrature baseband signal quadrature phase component.

A synchronization/modulation method determination section 1506 detects the unique word 104 of the frame configuration transmitted by the base station in FIG. 14 from the received quadrature baseband signal in-phase component and received quadrature baseband signal quadrature phase component output from the receive radio section 1502 and achieves time synchronization with the base station, and also detects modulation method information 1301, estimates the modulation method, and outputs a synchronization signal and modulation method information to each modulation method detection section.

If modulation method information indicates QPSK based on the received quadrature baseband signal in-phase component and received quadrature baseband signal, synchronization signal, and modulation method information, the QPSK detection section 1503 performs demodulation and outputs a QPSK-detected received digital signal.

If modulation method information indicates 16QAM based on the received quadrature baseband signal in-phase component and received quadrature baseband signal, synchronization signal, and modulation method information, the 16QAM detection section 1504 performs demodulation and outputs a 16QAM-detected received digital signal.

If modulation method information indicates 64QAM based on the received quadrature baseband signal in-phase component and received quadrature baseband signal, synchronization signal, and modulation method information, the 64QAM detection section 1505 performs demodulation and outputs a 64QAM-detected received digital signal.

An interference wave strength estimation section 1507 estimates interference wave strength from a modulation signal, unique word, or pilot symbol in the received quadrature baseband signal in-phase component and received quadrature baseband signal quadrature phase component output from the receive radio section 1502, and outputs an interference wave strength estimation signal to a radio wave propagation environment estimation section 1511.

A field strength estimation section 1508 estimates the reception field strength or carrier power to noise power ratio from a modulation signal, unique word, or pilot symbol in the received quadrature baseband signal in-phase component and received quadrature baseband signal quadrature phase component output from the receive radio section 1502, and outputs a field strength estimation signal to the radio wave propagation environment estimation section 1511.

A multipath estimation section 1509 estimates the multipath situation from a modulation signal, unique word, or pilot symbol in the received quadrature baseband signal in-phase component and received quadrature baseband signal quadrature phase component output from the receive radio section 1502, and outputs a multipath estimation signal to the radio wave propagation environment estimation section 1511.

A Doppler frequency estimation section 1510 estimates the Doppler frequency from a modulation signal, unique word, or pilot symbol in the received quadrature baseband signal in-phase component and received quadrature baseband signal quadrature phase component output from the receive radio section 1502, and outputs a Doppler frequency estimation signal to the radio wave propagation environment estimation section 1511.

The radio wave propagation environment estimation section 1511 determines and outputs the modulation method to be requested of the base station from the interference wave strength estimation signal, field strength estimation signal, multipath estimation signal, and Doppler frequency estimation signal, so that, for example, QPSK is selected when the field strength is weak, when the Doppler frequency is large, when there is a plurality of arriving waves, or when the interference wave strength is great. If it is determined by the multipath estimation section 1509 that there is a plurality of arriving waves, other parameters indicating the radio wave propagation environment have no effect, and the radio wave propagation environment estimation section 1511 selects a modulation method with good error tolerance (in this embodiment, QPSK), and issues a request to the communication terminal accordingly. Alternatively, the radio wave propagation environment estimation section 1511 may output the interference wave strength estimation signal, field strength estimation signal, multipath estimation signal, and Doppler frequency estimation signal themselves. This is done to prevent the reception of a plurality of arriving waves, since the receiving apparatus cannot perform signal demodulation in such a case.

Next, the operation of a base station and communication terminal that have the above-described configurations will be described. First, in the communication terminal transmitting apparatus shown in FIG. 15, transmit data and a radio wave propagation environment estimation signal are generated as a transmit digital signal in accordance with the frame configuration in FIG. 12 by the transmit data generating section 1401, and output to the quadrature baseband signal generating section 1402.

The transmit digital signal output from the transmit data generating section 1401 is generated as a transmit quadrature baseband signal in-phase component and transmit quadrature baseband signal quadrature phase component by the quadrature baseband signal generating section 1402, and output to the transmit radio section 1403.

The transmit quadrature baseband signal in-phase component and transmit quadrature baseband signal quadrature phase component output from the quadrature baseband signal generating section 1402 undergo predetermined radio processing by the transmit radio section 1403, and a transmit signal is output to the transmission power amplification section 1404.

The transmit signal on which predetermined radio processing has been performed by the transmit radio section undergoes power amplification by the transmission power amplification section 1404 and is transmitted via the transmit antenna 1405.

The signal transmitted by the communication terminal is received by the base station shown in FIG. 13. In FIG. 13, the signal received via the receive antenna 1201 (received signal) undergoes predetermined radio processing by the receive radio section 1202, and the received quadrature baseband signal in-phase component and received quadrature baseband signal quadrature phase component are output to the synchronization section 1203 and detection section 1204.

For the received quadrature baseband signal in-phase component and received quadrature baseband signal quadrature phase component output from the receive radio section 1202, a unique word is detected by the synchronization section 1203, time synchronization with the communication terminal is achieved based on the detected unique word, and a synchronization signal is generated and output to the detection section 1204.

The received quadrature baseband signal in-phase component and received quadrature baseband signal quadrature phase component output from the receive radio section 1202 undergo detection processing by the detection section 1204 based on the synchronization signal output from the synchronization section 1203, and a received digital signal is output to the data detection section 1205.

For the received digital signal output from the detection section 1204, radio wave propagation environment information is generated by the data detection section 1205, and is output to the transmit data generating section 1206. In addition, receive data is output.

With regard to the radio wave propagation environment information output from the data detection section 1205, the modulation method is determined by the transmit data generating section 1206 according to the radio wave propagation environment so that, for example, QPSK is selected when the field strength is weak, when the Doppler frequency is large, when there is a plurality of arriving waves, or when the interference wave strength is great, then the transmit data is modulated using that modulation method, and a transmit digital signal is output. In addition, a control signal modulated using the determined modulation method is output.

Next, the signal transmitted from the base station transmitting apparatus (see FIG. 2) is received by the communication terminal receiving apparatus shown in FIG. 16. In FIG. 16, the signal received via the receive antenna 1501 (received signal) undergoes predetermined reception processing by the receive radio section 1502, and the received quadrature baseband signal in-phase component and received quadrature baseband signal quadrature phase component are output to the interference wave strength estimation section 1507, field strength estimation section 1508, multipath estimation section 1509, Doppler frequency estimation section 1510, QPSK detection section 1503, 16QAM detection section 1504, 64QAM detection section 1505, and synchronization/modulation method determination section 1506.

For the received quadrature baseband signal in-phase component and received quadrature baseband signal quadrature phase component output from the receive radio section 1502, a unique word is detected by the synchronization/modulation method determination section 1506, and time synchronization with the base station is achieved based on the detected unique word. In addition, modulation method information is detected, the modulation method is estimated, and a synchronization signal and modulation method information are output to each modulation method detection section.

The received quadrature baseband signal in-phase component and received quadrature baseband signal quadrature phase component output from the receive radio section 1502 are demodulated in a modulation method detection section based on the synchronization signal and modulation method information output from the synchronization/modulation method determination section 1506, and a corresponding received digital signal is output.

For the received quadrature baseband signal in-phase component and received quadrature baseband signal quadrature phase component output from the receive radio section 1502, parameters for estimating the propagation environment are estimated in each estimation section, and an estimation signal is output to the radio wave propagation environment estimation section 1511.

For the estimation signal output from each estimation section, the radio wave propagation environment is determined as a whole by the radio wave propagation environment estimation section 1511, and radio wave propagation environment information to be reported to the base station is estimated and output.

Next, an explanation will be given concerning the modulation method selected initially for a transmit signal to be transmitted by a base station. When a radio communication system of the kind described in this embodiment is constructed, for example, the modulation method to be used initially for a signal to be transmitted by the base station presents a problem. In this case, since a signal has not once been transmitted to the communication terminal, the communication terminal cannot estimate the radio wave propagation environment. Therefore, the base station must itself decide the modulation method to be used initially. If, for example, 16QAM or 64QAM is used as the initial modulation method, a communication terminal will not be able to attain data quality when the radio wave propagation environment is poor. Taking this fact into consideration, it is preferable to select QPSK modulation.

By selecting the most noise tolerant of the switchable modulation methods as the initially selected modulation method, as described above, data quality is improved at the communication terminal. This initial setting of the modulation method is not limited to this embodiment, and can be applied to communication methods characterized by switching of the modulation method according to the radio wave propagation environment, communication traffic, and so forth.

Similarly, with a communication method characterized by changing of the error correction method according to the radio wave propagation environment, the same kind of approach can be taken to the initial error correction method for a transmit signal to be transmitted. By selecting the error correction method with the greatest error correction capability from among the switchable error correction methods as the initially selected error correction method, data quality is improved. This initial setting of the error correction method is not limited to this embodiment, and can be applied to communication methods characterized by switching of the error correction method according to the radio wave propagation environment, communication traffic, and so forth.

If the modulation method is variable, the preamble 1101 excluding data symbols 102, the unique word 104, and the pilot symbol 103 in FIG. 14 are constantly transmitted. Using these signals transmitted by the base station, a communication terminal estimates the radio wave propagation environment and in starting communication with the base station transmits radio wave propagation environment information to the base station, and the base station determines the initial modulation method for the data symbols 102 based on the radio wave propagation environment information transmitted from the communication terminal, thereby enabling data quality to be attained. At this time, modulation method information can also be included in the radio wave propagation environment information. Initial setting of the modulation method by this method is not limited to this embodiment, and can be applied to communication methods characterized by switching of the modulation method according to the radio wave propagation environment, communication traffic, and so forth. Also, while the preamble, unique word, and pilot symbol have been described as constantly transmitted signals, this is not a limitation, and special symbols for radio wave propagation environment estimation may also be inserted.

Similarly, with a communication method characterized by changing of the error correction method according to the radio wave propagation environment, for example, the same kind of approach can be taken to the error correction method for initial transmission. Having the communication terminal estimate the radio wave propagation environment from the signals constantly transmitted by the base station, and having the base station decide on the data symbol error correction method based on radio wave propagation environment information transmitted from the communication terminal, enables data quality to be attained. At this time, error correction method information can also be included in the radio wave propagation environment information. Initial setting of the modulation method by this method is not limited to this embodiment, and can be applied to communication methods characterized by switching of the modulation method according to the radio wave propagation environment, communication traffic, and so forth.

By means of the above, it is possible to configure a radio communication system, transmitting apparatus, and receiving apparatus that use the method described in Embodiment 1, and by this means, it is possible to improve the reception sensitivity characteristics of a receiving apparatus. In this case, the description has referred to a combination of three kinds of modulation methods—QPSK, 16QAM, and 64QAM—but this embodiment is not limited to this, and neither is it limited to switching between three kinds of modulation methods. Moreover, in FIG. 3 and FIG. 13 it is also possible to input communication traffic information, for example, and to consider this in deciding on the modulation method. Furthermore, interference wave strength, field strength, the multipath situation, and Doppler frequency have been described as radio wave propagation environment parameters by way of examples, but this embodiment is not limited to these.

(Embodiment 3)

In Embodiment 3, initial settings and a setting method are described for a case where the modulation method of each channel is changed adaptively according to the radio wave propagation environment, communication traffic, and so forth, in the CDMA method. At this time, a communication method is used whereby the base station primary modulation (data modulation) can be switched between QPSK modulation, 16QAM, and 64QAM, according to the radio wave propagation environment, communication traffic, and so forth.

Figure 17:
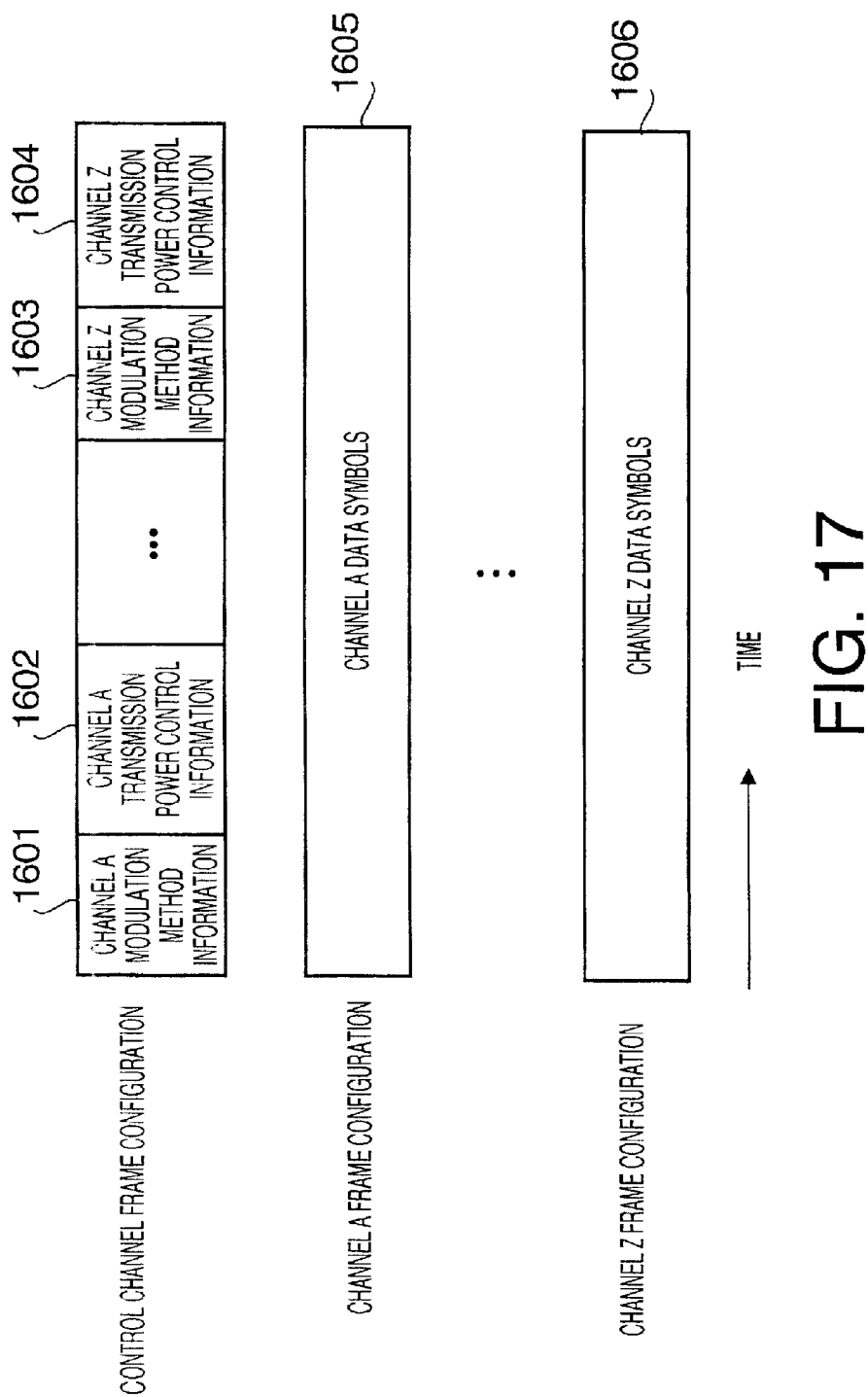
FIG. 17 is a drawing showing examples of the frame configurations of signals transmitted by a base station in the CDMA method according to Embodiment 3 of the present invention.

FIG. 17 shows examples of the frame configurations of signals transmitted by a base station in the CDMA method according to this embodiment. The control channel frame is composed of channel A modulation method information 1601, channel A transmission power control information 1602, channel Z modulation method information 1603, and channel Z transmission power control information 1604. The channel A frame configuration comprises channel A data symbols 1605, and the QPSK, 16QAM, or 64QAM modulation method is used for primary modulation of channel A data symbols 1605. The channel Z frame configuration comprises channel Z data symbols 1606, and the QPSK, 16QAM, or 64QAM modulation method is used for primary modulation of channel Z data symbols 1606.

Figure 18:
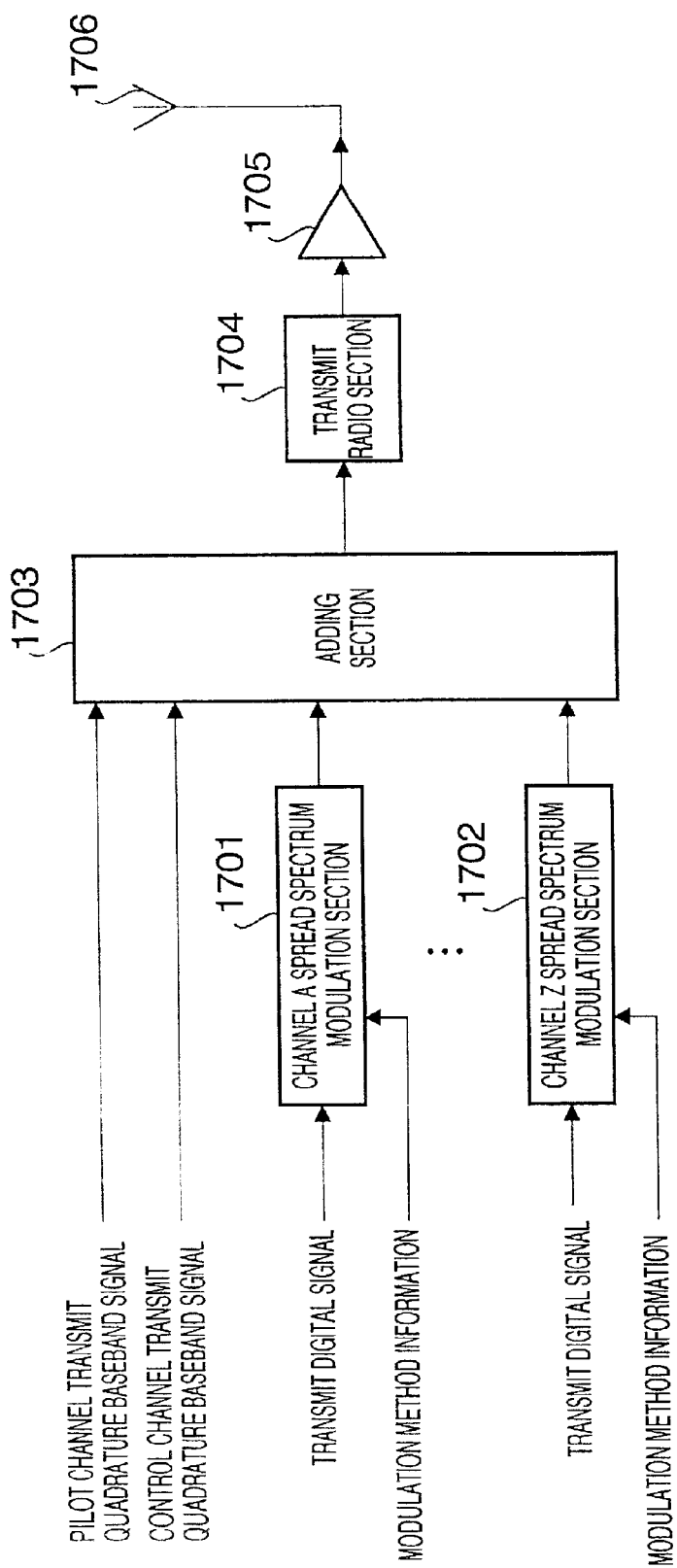
FIG. 18 is a block diagram showing the configuration of the transmitting apparatus of a base station in the CDMA method according to Embodiment 3 of the present invention.

FIG. 18 shows the configuration of the transmitting apparatus of a base station in the CDMA method according to this embodiment. A channel A spread spectrum modulation section 1701 performs QPSK modulation, 16QAM, or 64QAM primary modulation on a channel A transmit digital signal based on channel A modulation method information in the input channel A transmit digital signal and channel A modulation method information, and outputs a channel A transmit quadrature baseband signal to an adding section 1703.

A channel Z spread spectrum modulation section 1702 performs QPSK modulation, 16QAM, or 64QAM primary modulation on a channel Z transmit digital signal based on channel Z modulation method information in the input channel Z transmit digital signal and channel Z modulation method information, and outputs a channel Z transmit quadrature baseband signal to the adding section 1703.

The adding section 1703 adds the input pilot channel transmit quadrature baseband signal, the control channel transmit quadrature baseband signal, the transmit quadrature baseband signal output from the channel A spread spectrum modulation section 1701, and the transmit quadrature baseband signal output from the channel Z spread spectrum modulation section 1702, and outputs the transmit quadrature baseband signal resulting from this addition to a transmit radio section 1704.

The transmit radio section 1704 performs predetermined radio processing on the post-addition transmit quadrature baseband signal output from the adding section 1703, and outputs a transmit signal.

A transmission power amplification section 1705 amplifies the transmit signal output from the transmit radio section 1704, and outputs the amplified transmit signal via an antenna 1706.

Figure 19:
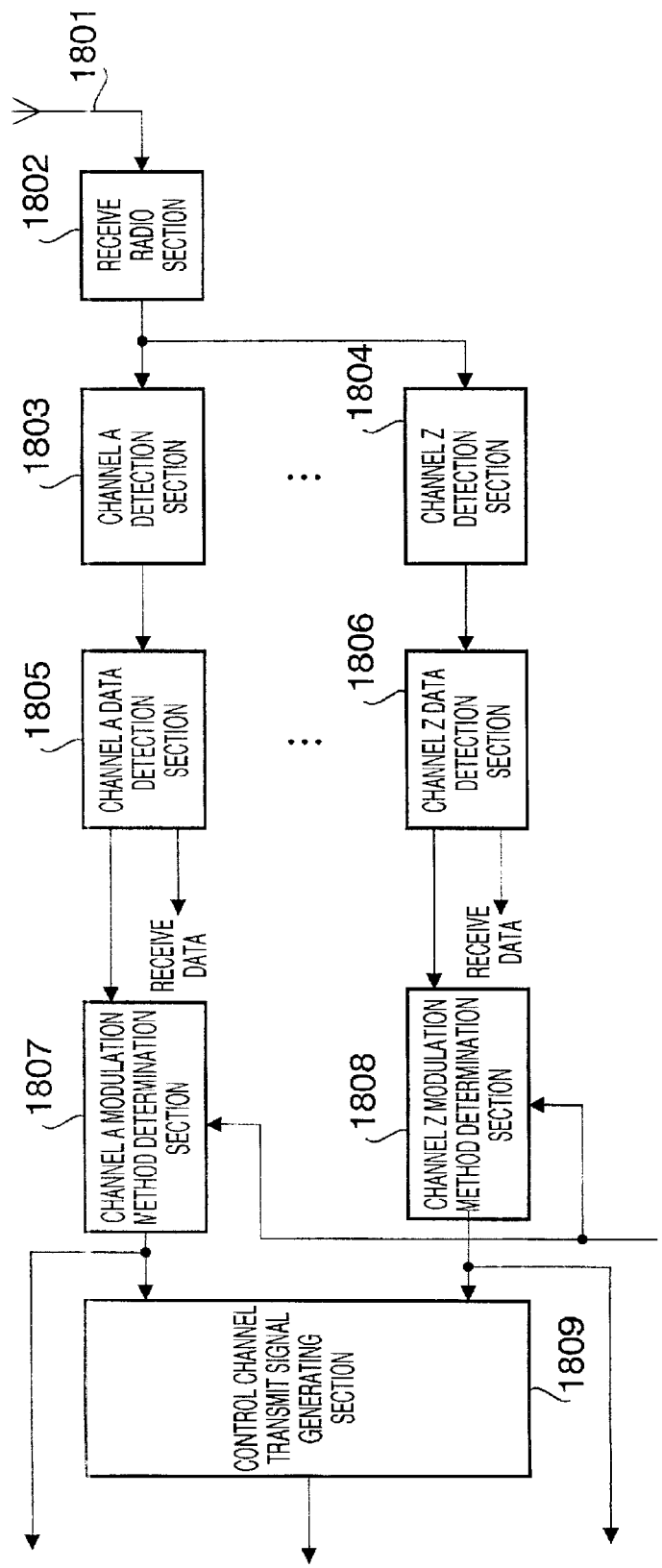
FIG. 19 is a block diagram showing the configuration of the receiving apparatus of a base station in the CDMA method according to Embodiment 3 of the present invention.

FIG. 19 shows the configuration of the receiving apparatus of a base station in the CDMA method according to this embodiment. A receive radio section 1802 performs predetermined radio processing on a signal received via an antenna 1801 (received signal), and outputs a received quadrature baseband signal to a channel A detection section 1803 and channel Z detection section 1804.

The channel A detection section 1803 performs detection processing on the received quadrature baseband signal output from the receive radio section 1802, and outputs a channel A received digital signal to a channel A data detection section 1805. Similarly, the channel Z detection section 1804 performs detection processing on the received quadrature baseband signal output from the receive radio section 1802, and outputs a channel Z received digital signal to a channel Z data detection section 1806.

The channel A data detection section 1805 generates radio wave propagation environment information estimated by the channel A communication terminal from the channel A received digital signal output from the channel A detection section 1803, and outputs it to a channel A modulation method determination section 1807.

The channel Z data detection section 1806 generates radio wave propagation environment information estimated by the channel Z communication terminal from the channel Z received digital signal output from the channel Z detection section 1804, and outputs it to a channel Z modulation method determination section 1808.

The channel A modulation method determination section 1807 selects a modulation method that offers both channel A communication terminal data quality and data transmission speed from among QPSK, 16QAM, and 64QAM, based on channel A radio wave propagation environment information output from the channel A data detection section 1805, and outputs this to a control channel transmit signal generating section 1809 as channel A modulation method information.

The channel Z modulation method determination section 1808 selects a modulation method that offers both channel Z communication terminal data quality and data transmission speed from among QPSK, 16QAM, and 64QAM, based on channel Z radio wave propagation environment information output from the channel Z data detection section 1806, and outputs this to the control channel transmit signal generating section 1809 as channel Z modulation method information.

Using channel A modulation method information output from the channel A modulation method determination section 1807 and channel Z modulation method information output from the channel Z modulation method determination section 1808, the control channel transmit signal generating section 1809 generates and outputs a control channel signal based on the control channel frame configuration in FIG. 17 containing channel A modulation method information and channel Z modulation method information.

Figure 20:
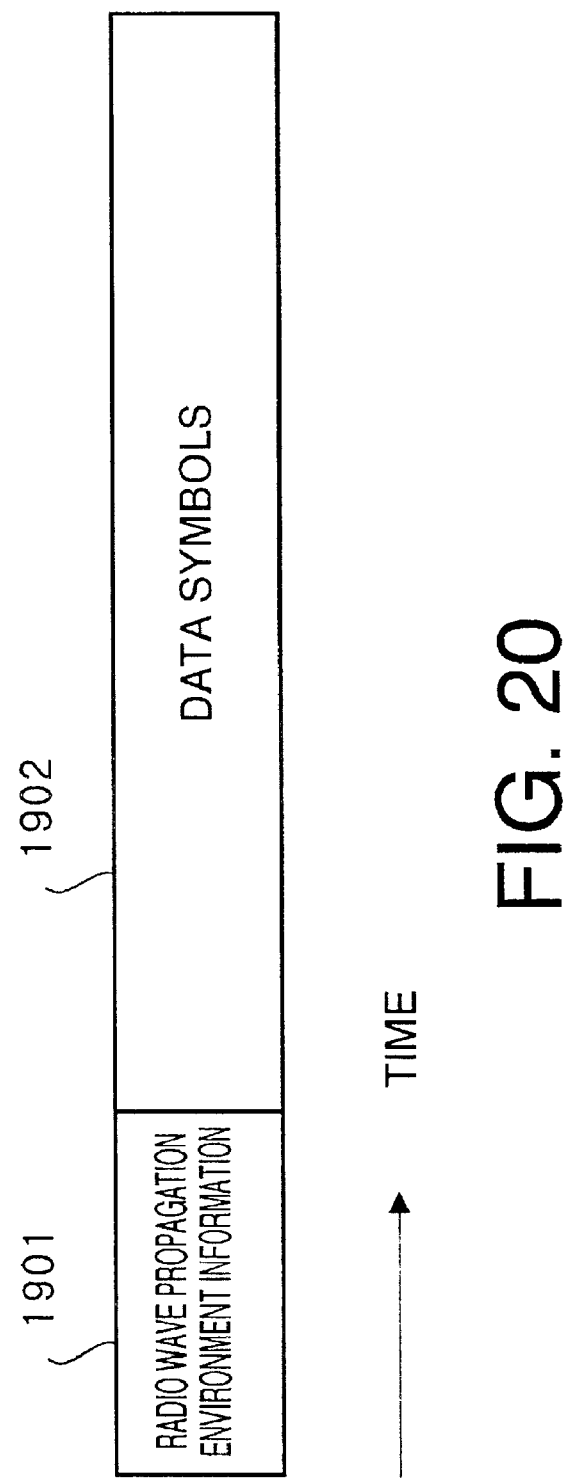
FIG. 20 is a drawing showing an example of the frame configuration of a signal transmitted by a communication terminal in the CDMA method according to Embodiment 3 of the present invention.

FIG. 20 shows an example of the frame configuration of a signal transmitted by a communication terminal in the CDMA method according to this embodiment. Reference code 1901 denotes radio wave propagation environment estimation information, whereby a communication terminal estimates the radio wave propagation environment of a signal transmitted by the base station, for notification to the base station. Reference code 1902 denotes data symbols.

Figure 21:
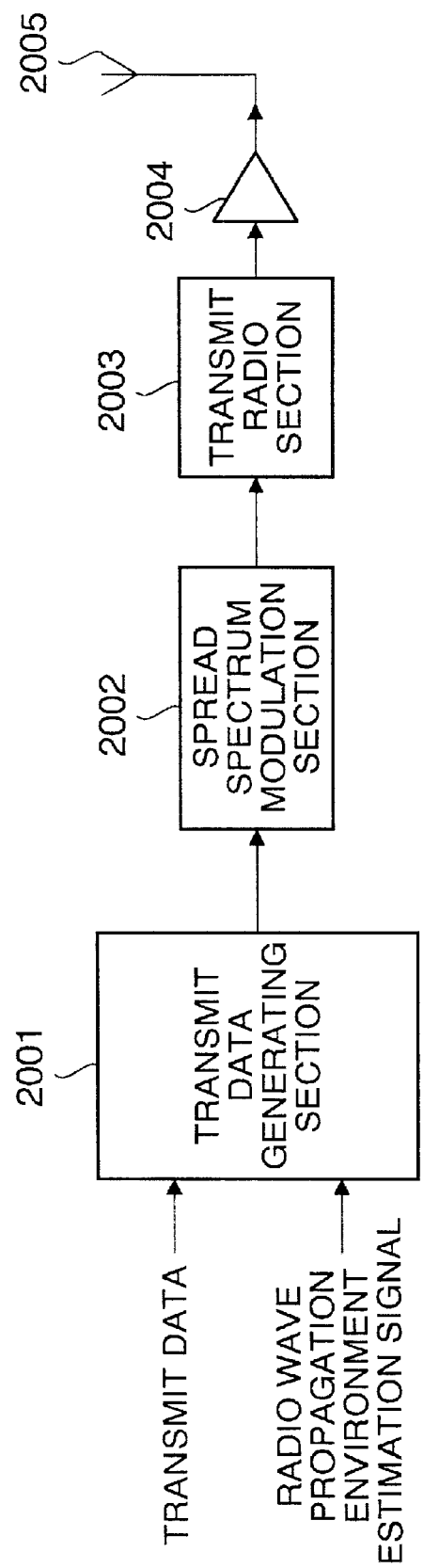
FIG. 21 is a block diagram showing the configuration of the transmitting apparatus of a communication terminal in the CDMA method according to Embodiment 3 of the present invention.

FIG. 21 shows the configuration of the transmitting apparatus of a communication terminal in the CDMA method according to this embodiment. A transmit data generating section 2001 generates a transmit digital signal from the input transmit data and radio wave propagation environment estimation signal, and outputs it to a spread spectrum modulation section 2002.

Figure 24:
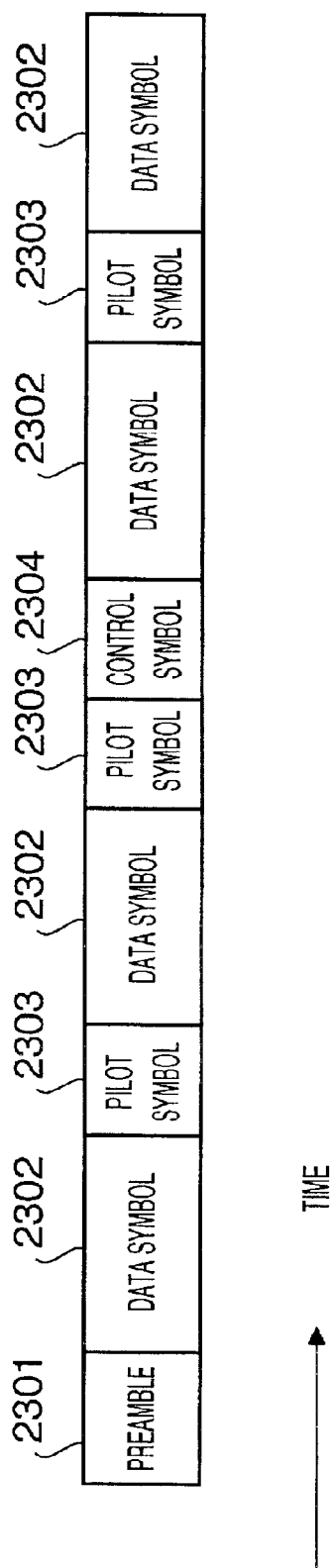
FIG. 24 is a drawing showing an example of a frame configuration according to Embodiment 5 of the present invention.

The spread spectrum modulation section 2002 performs spectrum spreading of the transmit digital signal output from the transmit data generating section 2001, and outputs a transmit quadrature baseband signal in accordance with the frame configuration in FIG. 24 to a transmit radio section 2003.

The transmit radio section 2003 performs predetermined radio processing on the transmit quadrature baseband signal output from the spread spectrum modulation section 2002, and outputs a transmit signal to a transmission power amplification section 2004.

The transmission power amplification section 2004 amplifies the transmit signal output from the transmit radio section 2003, and outputs the amplified transmit signal via an antenna 2005.

Figure 22:
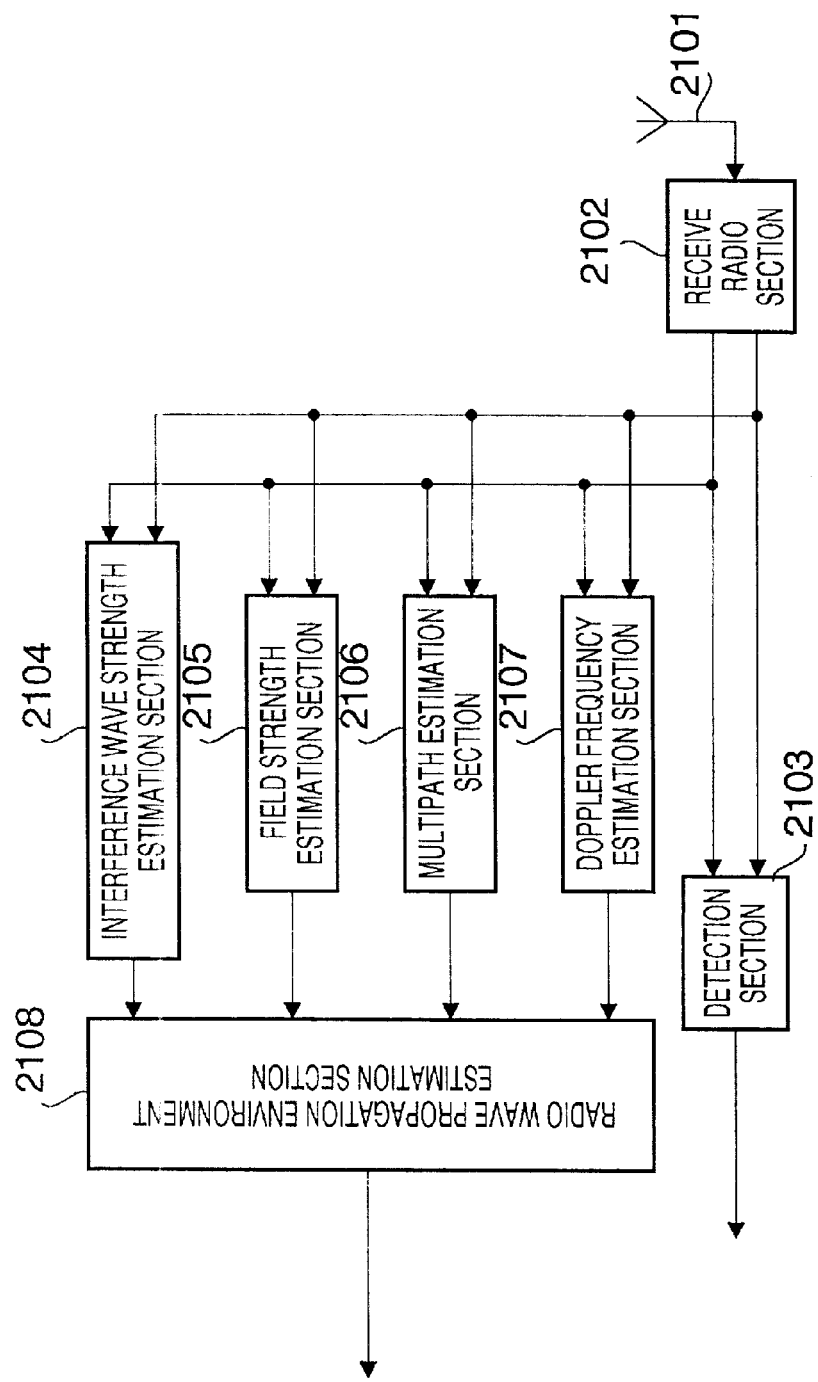
FIG. 22 is a block diagram showing the configuration of the receiving apparatus of a communication terminal in the CDMA method according to Embodiment 3 of the present invention.

FIG. 22 shows the configuration of the receiving apparatus of a communication terminal in the CDMA method according to this embodiment. In FIG. 22, a signal received via an antenna 2101 (received signal) undergoes predetermined reception processing by a receive radio section 2102, and a received quadrature baseband signal in-phase component and received quadrature baseband signal quadrature phase component are output to a detection section 2103, interference wave strength estimation section 2104, field strength estimation section 2105, multipath estimation section 2106, and Doppler frequency estimation section 2107.

The detection section 2103 performs detection processing on the received quadrature baseband signal in-phase component and received quadrature baseband signal quadrature phase component output from the receive radio section 2102, and outputs the resulting signal.

The interference wave strength estimation section 2104 estimates the interference wave strength from the pilot channel component and control channel component in the received quadrature baseband signal in-phase component and received quadrature baseband signal quadrature phase component output from the receive radio section 2102, and outputs an interference wave strength estimation signal to a radio wave propagation environment estimation section 2108.

The field strength estimation section 2105 estimates the reception field strength from the pilot channel component and control channel component in the received quadrature baseband signal in-phase component and received quadrature baseband signal quadrature phase component output from the receive radio section 2102, and outputs a field strength estimation signal to the radio wave propagation environment estimation section 2108.

The multipath estimation section 2106 estimates the multipath situation from the pilot channel component and control channel component in the received quadrature baseband signal in-phase component and received quadrature baseband signal quadrature phase component output from the receive radio section 2102, and outputs a multipath estimation signal to the radio wave propagation environment estimation section 2108.

The Doppler frequency estimation section 2107 estimates the Doppler frequency from the pilot channel component and control channel component in the received quadrature baseband signal in-phase component and received quadrature baseband signal quadrature phase component output from the receive radio section 2102, and outputs a Doppler frequency estimation signal to the radio wave propagation environment estimation section 2108.

By inserting modulation method information transmitted by the base station into the control channel, as described above, it is possible for the base station to send the modulation method of the transmit signal being transmitted to a communication terminal. Also, in particular, by having a communication terminal employ a method whereby the radio wave propagation environment is estimated using a pilot channel and control channel transmitted by the base station, it is possible for the communication terminal to estimate the radio wave propagation environment even when the base station is not transmitting data symbols to the communication terminal.

By adopting the above-described means, it is possible to achieve a radio communication system configuration whereby the modulation method of each channel is switched adaptively according to the radio wave propagation environment, communication traffic, and so forth, in the CDMA method. Similarly, it is possible to configure a radio communication system whereby the error correction method of each channel is variable according to the radio wave propagation environment, communication traffic, and so forth.

Next, a description will be given of the initial setting method for the modulation method when the modulation method of each channel is variable according to the radio wave propagation environment, communication traffic, and so forth, in the CDMA method. When a radio communication system of the kind described in this embodiment is constructed, for example, the modulation method to be used initially for a transmit signal to be transmitted by the base station presents a problem. In this case, if, for example, 16QAM or 64QAM is used as the initial modulation method, a communication terminal will not be able to attain data quality when the radio wave propagation environment is poor. Taking this fact into consideration, it is preferable to select QPSK modulation.

By selecting the most noise tolerant of the switchable modulation methods as the initially selected modulation method, as described above, data quality is improved at the communication terminal.

Similarly, with a communication method whereby the error correction method of each channel is variable according to the radio wave propagation environment, communication traffic, and so forth, for example, the same kind of approach can be taken to the error correction method for initial transmission. By selecting the error correction method with the greatest error correction capability from among the switchable error correction methods as the initially selected error correction method, data quality is improved.

The initial setting method will now be described for a case where the modulation method of each channel is switched according to the radio wave propagation environment, communication traffic, and so forth, in the CDMA method. With this method, a communication terminal estimates the radio wave propagation environment from the signals the base station transmits constantly, for example, pilot channel and control channel signals even when the communication terminal is not performing data communication with the base station. Then, when starting data communication with the base station, the communication terminal first transmits radio wave propagation environment information estimated from the pilot channel and control channel signals to the base station, and after the base station receives this radio wave propagation environment information, the base station makes a decision so that, for example, QPSK is selected as the modulation method of the signal to be transmitted when the field strength is weak, when the Doppler frequency is large, when there is a plurality of arriving waves, or when the interference wave strength is great. By means of the above, the quality of the initial data transmitted by the base station is improved at the communication terminal.

Similarly, implementation is also possible in a communication system whereby the error correction method for the modulation method of each channel is variable according to the radio wave propagation environment, communication traffic, and so forth. A communication terminal estimates the radio wave propagation environment information estimated from the pilot channel and control channel constantly transmitted by the base station, and when starting communication with the base station, transmits radio wave propagation environment information to the base station, which decides on the data symbol error correction method so that, for example, a method with good error correction capability is selected when the field strength is weak, when the Doppler frequency is large, when there is a plurality of arriving waves, or when the interference wave strength is great, thereby enabling data quality to be attained. In the descriptions relating to the CDMA method, a pilot channel and control channel have been described as examples of constantly transmitted signals, but this is not a limitation, and any signal may be used as long as it is constantly transmitted. Also, the modulation method for signals transmitted by the base station has been described as variable, but this is not a limitation, and it is also possible for the modulation method of signals transmitted by a communication terminal to be made variable.

By means of the above, it is possible to configure a radio communication system, transmitting apparatus, and receiving apparatus that use the method described in Embodiment 1, and by this means, it is possible to improve the reception sensitivity characteristics of a receiving apparatus. In this case, the description has referred to a combination of three kinds of modulation methods—QPSK, 16QAM, and 64QAM—but this embodiment is not limited to this, and neither is it limited to switching between three kinds of modulation methods. Moreover, in FIG. 3 and FIG. 13 it is also possible to input communication traffic information, for example, and to consider this in deciding on the modulation method. Furthermore, interference wave strength, field strength, the multipath situation, and Doppler frequency have been described as radio wave propagation environment parameters by way of examples, but this embodiment is not limited to these.

(Embodiment 4)

In Embodiment 4, a description is given of a radio communication system, transmitting apparatus, and receiving apparatus that use the method described in Embodiment 1.

Figure 23:
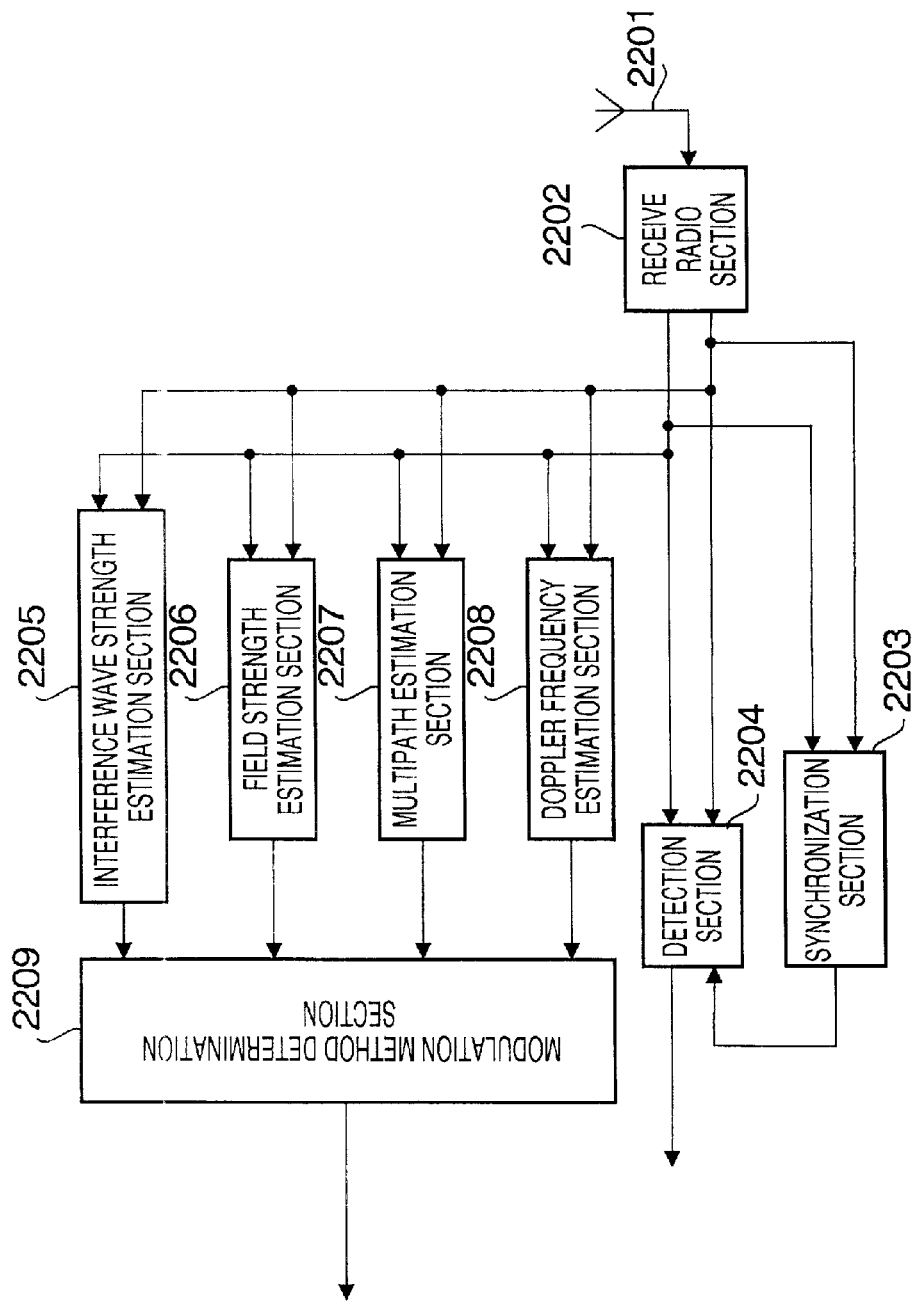
FIG. 23 is a block diagram showing the configuration of the receiving apparatus of a base station according to Embodiment 4 of the present invention.

The configuration of a base station transmitting apparatus according to this embodiment is as shown in FIG. 2, and a detailed explanation of this configuration is omitted here. FIG. 23 shows the configuration of the receiving apparatus of a base station according to this embodiment. A receive radio section 2202 performs predetermined radio processing on a signal received via an antenna 2201, and outputs a received quadrature baseband signal in-phase component and received quadrature baseband signal quadrature phase component.

A synchronization section 2203 achieves time synchronization with a communication terminal based on the received quadrature baseband signal in-phase component and received quadrature baseband signal quadrature phase component output from the receive radio section 2202, and outputs a synchronization signal to a detection section 2204.

The detection section 2204 performs detection processing using the received quadrature baseband signal in-phase component and received quadrature baseband signal quadrature phase component output from the receive radio section 2202, and the synchronization signal output from the synchronization section 2203, and outputs a received digital signal.

An interference wave strength estimation section 2205 estimates the interference wave strength from the received quadrature baseband signal in-phase component and received quadrature baseband signal quadrature phase component output from the receive radio section 2202, and outputs an interference wave strength estimation signal to a modulation method determination section 2209.

A field strength estimation section 2206 estimates the field strength from the received quadrature baseband signal in-phase component and received quadrature baseband signal quadrature phase component output from the receive radio section 2202, and outputs a field strength estimation signal to the modulation method determination section 2209.

A multipath estimation section 2207 estimates the multipath situation from the received quadrature baseband signal in-phase component and received quadrature baseband signal quadrature phase component output from the receive radio section 2202, and outputs a multipath estimation signal to the modulation method determination section 2209.

A Doppler frequency estimation section 2208 estimates the Doppler frequency from the received quadrature baseband signal in-phase component and received quadrature baseband signal quadrature phase component output from the receive radio section 2202, and outputs a Doppler frequency estimation signal to the modulation method determination section 2209.

Based on the interference wave strength estimation signal, field strength estimation signal, multipath estimation signal, and Doppler frequency estimation signal, the modulation method determination section 2209 makes a decision so that, for example, QPSK is selected when the field strength is weak, when the Doppler frequency is large, when there is a plurality of arriving waves, or when the interference wave strength is great, and outputs a control signal.

Next, a description will be given concerning the modulation method for initial transmission by the base station. When a radio communication system of the kind described in this embodiment is constructed, for example, a communication terminal first transmits a transmit signal, the base station receives the signal transmitted by the communication terminal and estimates the radio wave propagation environment, and decides on the modulation method so that, for example, QPSK is selected when the field strength is weak, when the Doppler frequency is large, when there is a plurality of arriving waves, or when the interference wave strength is great. By determining the modulation method for initial transmission in this way, data quality is improved at the communication terminal. This initial setting of the modulation method is not limited to this embodiment, and can be applied to communication methods characterized by switching of the modulation method according to the radio wave propagation environment, communication traffic, and so forth.

Similarly, with a communication method characterized by changing of the error correction method according to the radio wave propagation environment, the same kind of approach can be taken to the error correction method for initial transmission. With regard to the initially selected error correction method, a communication terminal first transmits transmit data, the base station receives the signal transmitted by the communication terminal, estimates the radio wave propagation environment, and decides on the error correction method so that, for example, a method with good error correction capability is selected when the field strength is weak, when the Doppler frequency is large, when there is a plurality of arriving waves, or when the interference wave strength is great, and it is only necessary to decide on the error correction method for signals that the base station transmits.

Determining the error correction method for initial transmission as described above enables data quality to be improved at the communication terminal. This initial setting of the error correction method is not limited to this embodiment, and can be applied to communication methods characterized by switching of the error correction method according to the radio wave propagation environment, communication traffic, and so forth.

By means of the above, it is possible to configure a radio communication system, transmitting apparatus, and receiving apparatus that use the method described in Embodiment 1, and by this means, it is possible to improve the reception sensitivity characteristics of a receiving apparatus. Moreover, in FIG. 3 and FIG. 13 it is also possible to input communication traffic information, for example, and to consider this in deciding on the modulation method. Furthermore, interference wave strength, field strength, the multipath situation, and Doppler frequency have been described as radio wave propagation environment parameters by way of examples, but this embodiment is not limited to these.

This embodiment does not depend on the multiplexing method, and may be implemented in the same way with the CDMA method and OFDM method.

(Embodiment 5)

In Embodiment 5, a description is given of a transmitting apparatus and receiving apparatus of the radio communication method of the present invention.

FIG. 24 shows an example of a frame configuration according to this embodiment. With respect to time on the horizontal axis, reference code 2301 denotes a preamble, comprising symbols by means of which the receiving apparatus achieves time synchronization with the transmitting apparatus. Reference code 2302 denotes data symbols, the modulation method being variable. Reference code 2303 denotes pilot symbols for estimating transmission path distortion and frequency offset. Reference code 2304 denotes control symbols for system control such as system information and cell information.

Figure 25:
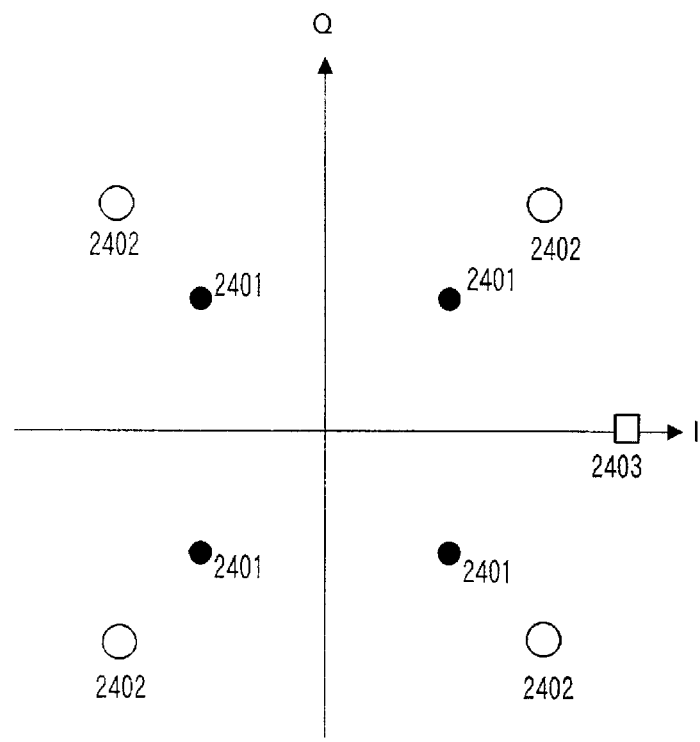
FIG. 25 is a drawing showing QPSK symbol and pilot symbol signal point arrangement in the IQ plane according to Embodiment 5 of the present invention.

FIG. 25 shows QPSK symbol and pilot symbol signal point arrangement in the IQ plane according to this embodiment. Reference code 2401 indicates FIG. 24 data symbol 2302 signal points, reference code 2402 indicates preamble 2301 and control symbol 2304 signal points, and reference code 2403 indicates the pilot symbol 2303 signal point. The reference code 2402 and reference code 2403 signal point amplitudes—that is, distances from the origin—are greater than the reference code 2401 signal point amplitudes. As a result, the accuracy of estimation of transmission path distortion by means of the pilot symbol and the accuracy of frequency offset estimation are improved in the receiving apparatus. Moreover, control symbol noise tolerance is increased. Signal point arrangement should be carried out so that use is possible with the method of transmission power amplifier use described in Embodiment 1.

Figure 26:
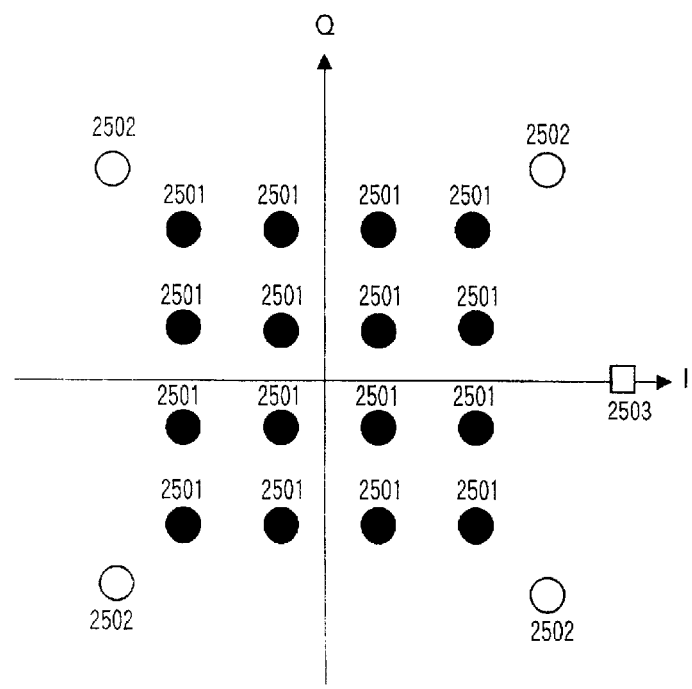
FIG. 26 is a drawing showing 16QAM symbol and pilot symbol signal point arrangement in the IQ plane according to Embodiment 5 of the present invention.

FIG. 26 shows 16QAM symbol and pilot symbol signal point arrangement in the IQ plane. Reference code 2501 indicates FIG. 24 data symbol 2302 signal points, reference code 2502 indicates preamble 2301 and control symbol 2304 signal points, and reference code 2503 indicates the pilot symbol 2303 signal point. The reference code 2502 and reference code 2503 signal point amplitudes—that is, distances from the origin—are greater than the reference code 2501 maximum signal point amplitudes. As a result, the accuracy of estimation of transmission path distortion by means of the pilot symbol and the accuracy of frequency offset estimation are improved in the receiving apparatus. Moreover, control symbol noise tolerance is increased. Signal point arrangement should be carried out so that use is possible with the method of transmission power amplifier use described in Embodiment 1.

Figure 27:
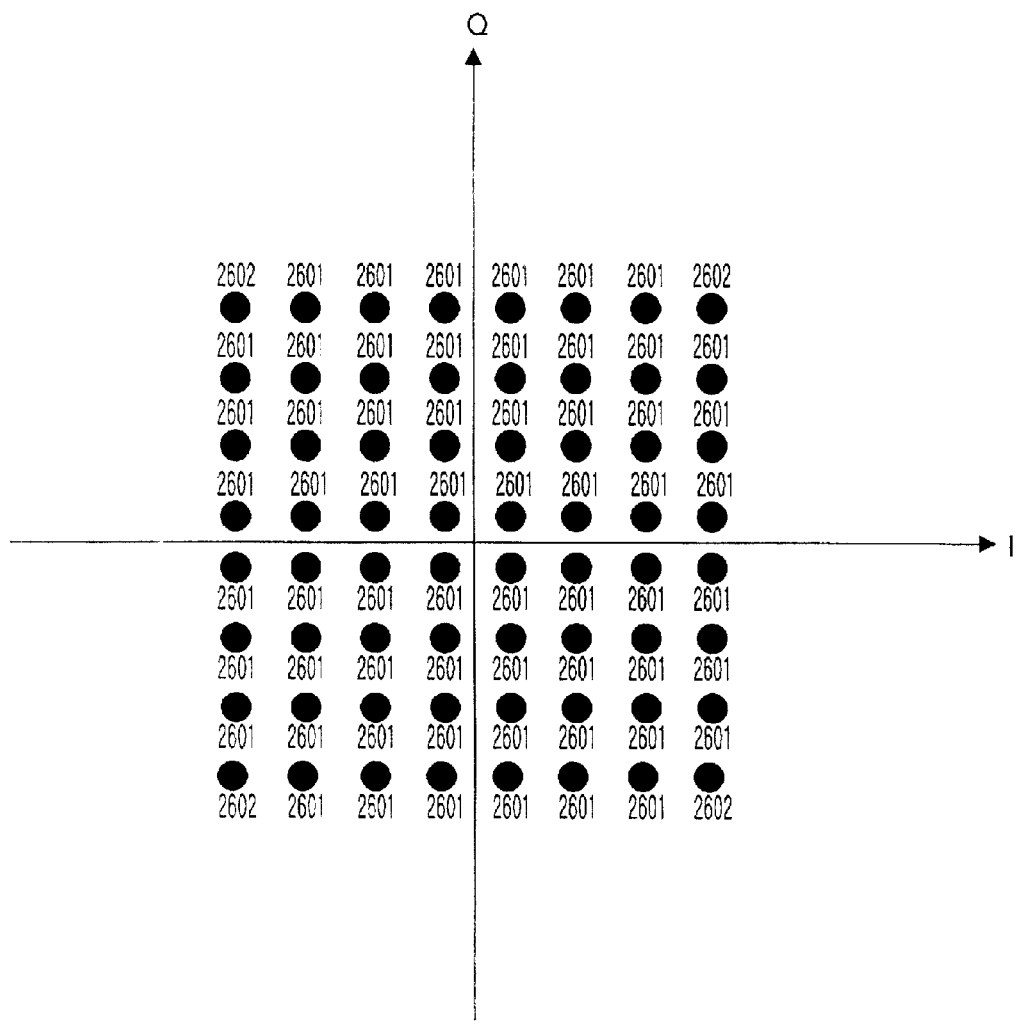
FIG. 27 is a drawing showing 64QAM symbol signal point arrangement in the IQ plane according to Embodiment 5 of the present invention.

FIG. 27 shows 64QAM symbol signal point arrangement in the IQ plane according to this embodiment. Reference code 2601 indicates FIG. 23 data symbol 2302 signal points, and the preamble 2301, pilot symbols 2303, and control symbols 2304 are taken as having one or other signal point that has the maximum amplitude shown by reference code 2602 in FIG. 27.

Figure 28:
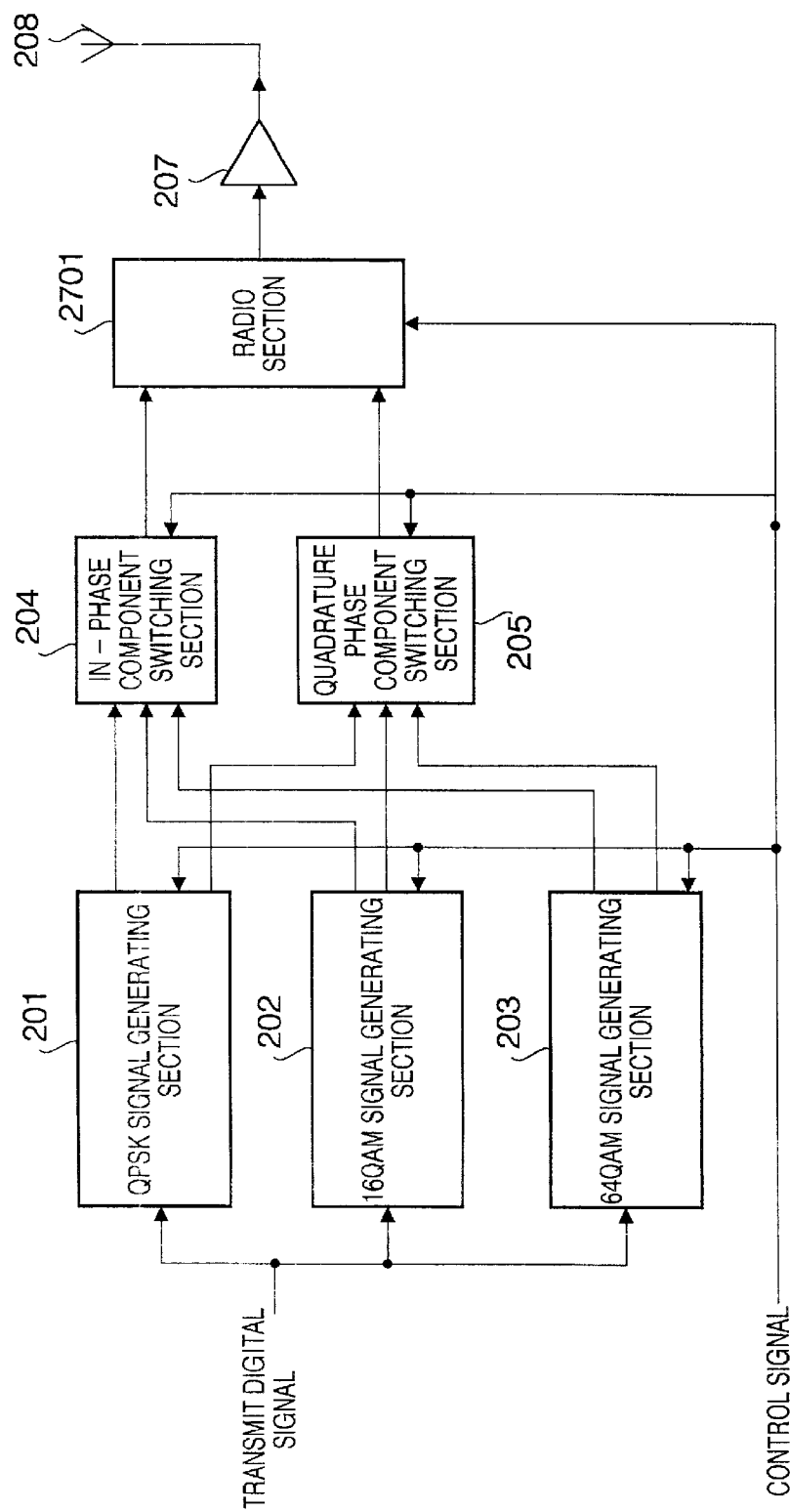
FIG. 28 is a drawing showing the configuration of a transmitting apparatus according to Embodiment 5 of the present invention.

FIG. 28 shows the configuration of a transmitting apparatus according to this embodiment. The parts in FIG. 28 identical to those in FIG. 3 are assigned the same codes as in FIG. 3 and their detailed explanations are omitted. Based on selected modulation method information contained in an input control signal, a radio section 2701 controls the gain of the transmit quadrature baseband signal in-phase component output from an in-phase component switching section 205 and the received quadrature baseband signal quadrature phase component output from a quadrature phase component switching section 205, and outputs a transmit signal to a transmission power amplification section 207.

Figure 29:
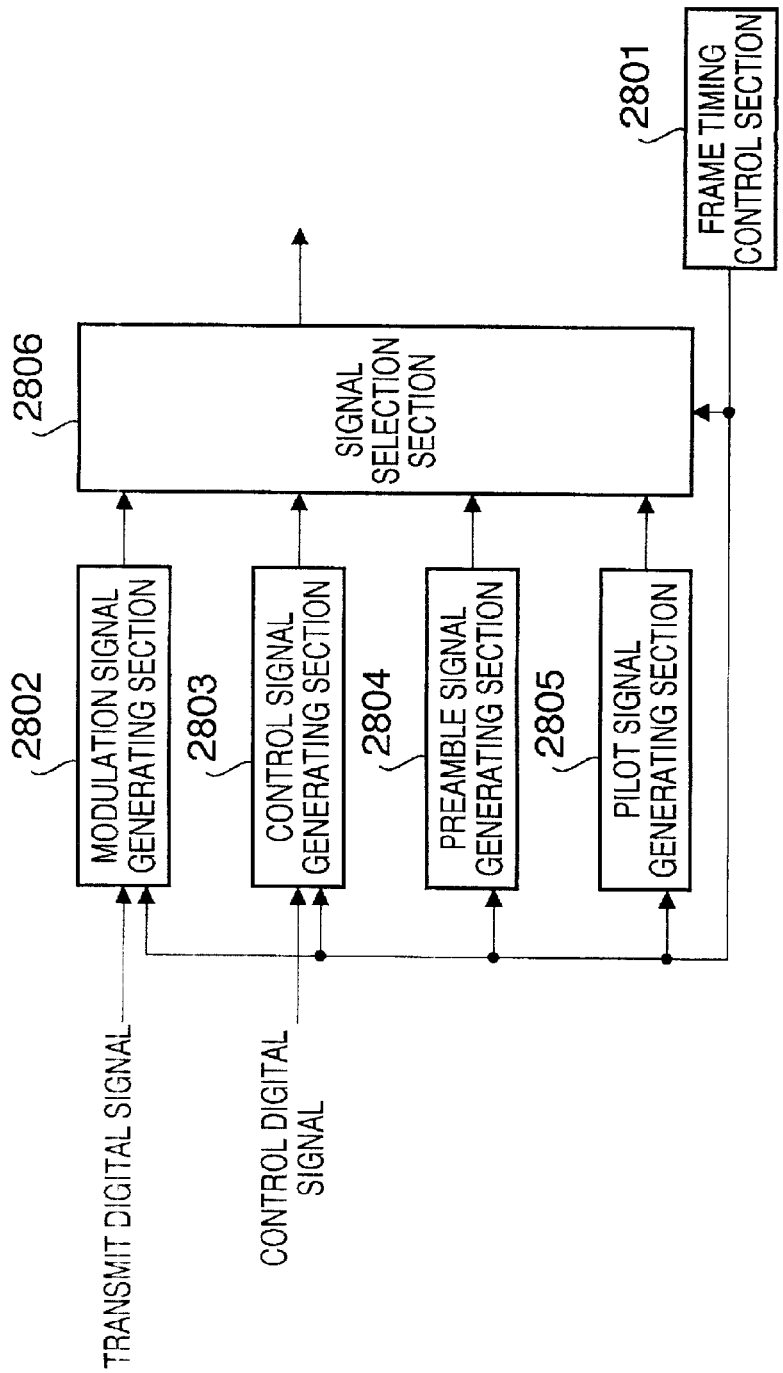
FIG. 29 is a block diagram showing the configuration of a quadrature baseband signal generating section according to Embodiment 5 of the present invention.

FIG. 29 shows the internal configuration of a signal generating section, indicating the detailed configuration of the QPSK signal generating section 201, 16QAM signal generating section 202, and 64QAM signal generating section 203 in FIG. 3 and FIG. 28.

In FIG. 29, a frame timing control section 2801 outputs a frame timing signal that controls frame timing to a modulation signal generating section 2802, control signal generating section 2803, preamble signal generating section 2804, pilot signal generating section 2805, and signal selection section 2806.

The modulation signal generating section 2802 generates a modulation signal based on the frame timing signal frame configuration in the frame timing signal output from the frame timing control section 2801, and outputs a data symbol transmit quadrature baseband signal to the signal selection section 2806.

The control signal generating section 2803 generates a control signal based on the frame timing signal frame configuration in the frame timing signal output from the frame timing control section 2801, and outputs a control signal transmit quadrature baseband signal to the signal selection section 2806.

The preamble signal generating section 2804 generates a preamble based on the frame configuration of the frame timing signal output from the frame timing control section 2801, and outputs a preamble transmit quadrature baseband signal to the signal selection section 2806.

The pilot signal generating section 2805 generates a pilot signal based on the frame configuration of the frame timing signal output from the frame timing control section 2801, and outputs a pilot signal transmit quadrature baseband signal to the signal selection section 2806.

The signal selection section 2806 selects a transmit quadrature baseband signal to be output based on the frame timing signal frame configuration from among the data symbol transmit quadrature baseband signal output from the modulation signal generating section 2802, the control signal transmit quadrature baseband signal output from the control signal generating section 2803, the preamble transmit quadrature baseband signal output from the preamble signal generating section 2804, the pilot signal transmit quadrature baseband signal output from the pilot signal generating section 2805, and the frame timing signal output from the frame timing control section 2801, and outputs the selected transmit quadrature baseband signal.

Figure 30:
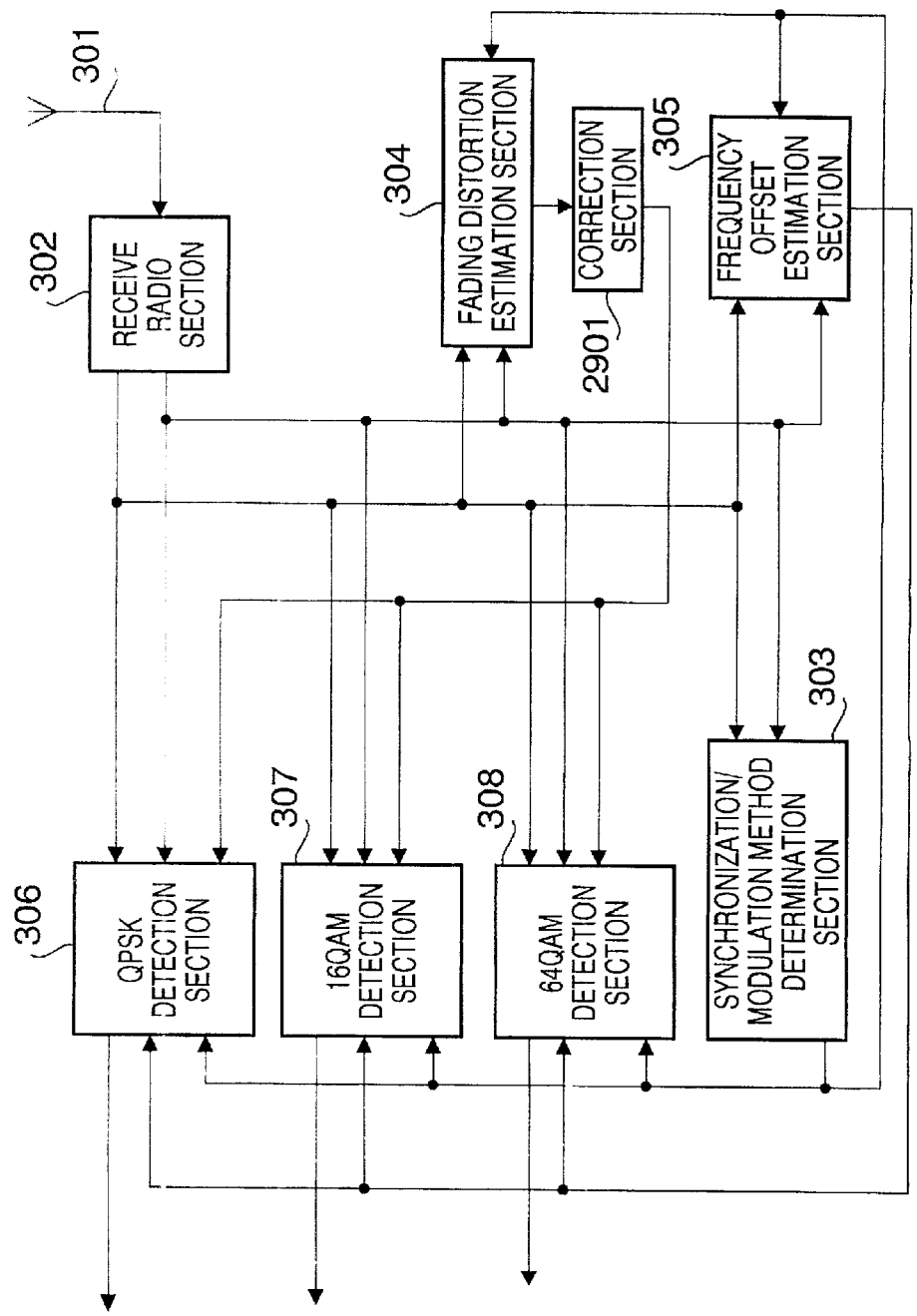
FIG. 30 is a drawing showing the configuration of a receiving apparatus according to Embodiment 5 of the present invention.

Then, the fading distortion estimation section 304 shown in FIG. 4 outputs a fading distortion estimation signal according to the modulation method based on the ratio of the pilot symbol signal point amplitude and the maximum signal point amplitude of each modulation method. The details of the configuration will now be described using FIG. 30. FIG. 30 shows the configuration of a receiving apparatus according to this embodiment. The parts in FIG. 30 identical to those in FIG. 4 are assigned the same codes as in FIG. 4 and their detailed explanations are omitted.

A correction section 2901 calculates a correction value based on control signal modulation method information in the fading distortion estimation signal output from the fading distortion estimation section 304 and input control signal, multiplies the fading distortion estimation signal by the correction value, and outputs the corrected fading distortion estimation signal to the QPSK detection section 306, 16QAM detection section 307, and 64QAM detection section 308. At this time, the correction value is determined from the ratio of the pilot symbol signal point amplitude to the maximum signal point amplitude of each modulation method. By this means, the estimation accuracy of the fading distortion estimation signal is increased and the reception sensitivity characteristics of the receiving apparatus are improved.

According to the above-described embodiment, modulation signals of a plurality of modulation methods can be amplified by a common power amplifier, and high-sensitivity reception can be achieved at the receiving apparatus.

(Embodiment 6)

Figure 31:
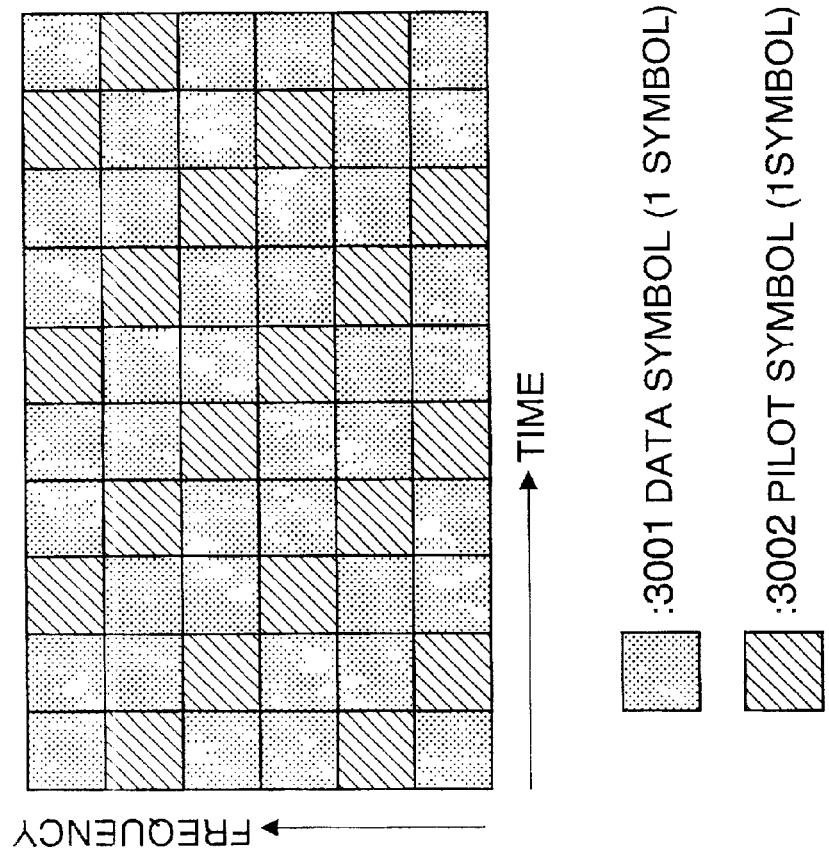
FIG. 31 is a drawing showing an example of the frame configuration of a signal transmitted by a base station according to Embodiment 6 of the present invention.

FIG. 31 shows an example of the frame configuration of a signal transmitted by a base station according to Embodiment 6. In FIG. 31, with respect to the time and frequency axes, reference code 3001 denotes a data symbol, with, for example, QPSK, 16QAM, or 64QAM selectable as the modulation method. Reference code 3002 denotes a pilot symbol, with the pilot symbol signal point amplitude being variable in the IQ plane as described in Embodiment 1 according to the data symbol 3001 modulation method.

Figure 32:
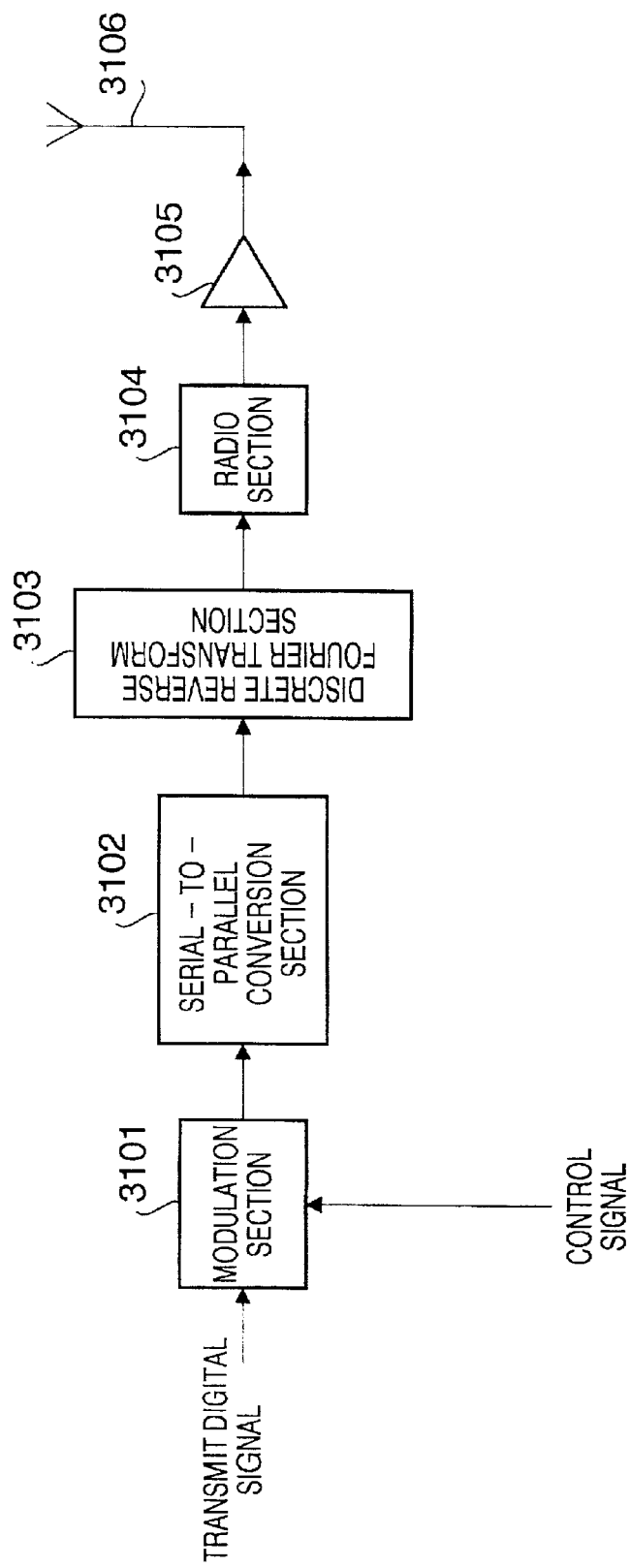
FIG. 32 is a block diagram showing the configuration of the transmitting apparatus of a base station according to Embodiment 6 of the present invention.

FIG. 32 shows the configuration of the transmitting apparatus of a base station according to this embodiment. In FIG. 32, a modulation section 3101 carries out modulation using the selected modulation method on an input transmit digital signal, based on modulation method and frame configuration information in an input control signal, and outputs a serial signal to a serial-to-parallel conversion section 3102.

The serial-to-parallel conversion section 3102 converts the serial signal output from the modulation section 3101 to parallel form, and outputs parallel signals to a discrete reverse Fourier transform section 3103. The discrete reverse Fourier transform section 3103 performs a discrete reverse Fourier transform on the parallel signals output from the serial-to-parallel conversion section 3102, and outputs the signals after the discrete reverse Fourier transform to a radio section 3104.

The radio section 3104 performs predetermined radio processing on the signals output from the discrete reverse Fourier transform section 3103, and outputs a transmit signal to a transmission power amplification section 3105. The transmission power amplification section 3105 amplifies the transmit signal output from the radio section 3104, and transmits the amplified transmit signal to a communication terminal via an antenna 3106.

Figure 33:
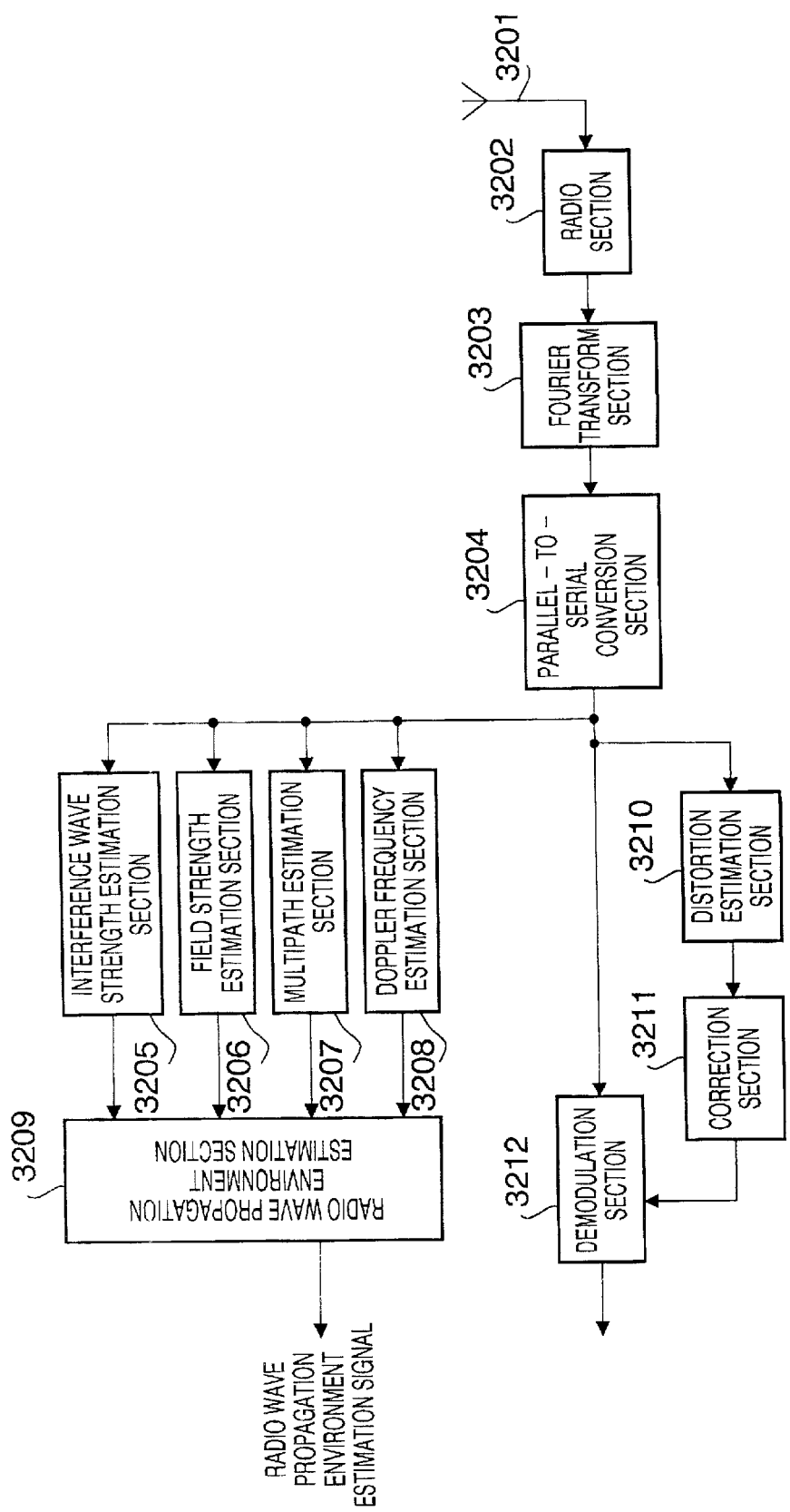
FIG. 33 is a block diagram showing the configuration of the receiving apparatus of a communication terminal according to Embodiment 6 of the present invention.

FIG. 33 shows the configuration of the receiving apparatus of a communication terminal according to this embodiment. In FIG. 33, a radio section 3202 performs predetermined radio processing on a signal received via an antenna 3201 (received signal), and outputs the resulting signal to a Fourier transform section 3203. The Fourier transform section 3203 performs a Fourier transform on the signal output from the radio section 3202, and outputs parallel signals to a parallel-to-serial conversion section 3204.

The parallel-to-serial conversion section 3204 performs parallel-to-serial conversion of the parallel signals output from the Fourier transform section 3203, and outputs a serial signal. An interference wave strength estimation section 3205 estimates interference wave strength based on the serial signal (a pilot symbol, for example) output from the parallel-to-serial conversion section 3204, and outputs an interference wave strength estimation signal to a radio wave propagation environment estimation section 3209.

A field strength estimation section 3206 estimates the field strength based on the serial signal (a pilot symbol, for example) output from the parallel-to-serial conversion section 3204, and outputs a field strength estimation signal to the radio wave propagation environment estimation section 3209. A multipath estimation section 3207 estimates the number of arriving waves based on the serial signal (a pilot symbol, for example) output from the parallel-to-serial conversion section 3204, and outputs a multipath estimation signal to the radio wave propagation environment estimation section 3209.

A Doppler frequency estimation section 3208 estimates the Doppler frequency based on the serial signal (a pilot symbol, for example) output from the parallel-to-serial conversion section 3204, and outputs a Doppler frequency estimation signal to the radio wave propagation environment estimation section 3209.

The radio wave propagation environment estimation section 3209 determines a request for the modulation method of a signal to be transmitted by the base station based on the interference wave strength estimation signal, field strength estimation signal, multipath estimation signal, and Doppler frequency estimation signal, and outputs this as a radio wave propagation environment estimation signal. Alternatively, the radio wave propagation environment estimation section 3209 may output the interference wave strength estimation signal, field strength estimation signal, multipath estimation signal, and Doppler frequency estimation signal themselves as radio wave propagation environment estimation signals.

Radio wave propagation environment estimation signal information is then transmitted from the transmitting apparatus of the communication terminal to the base station, and the modulation method of signals transmitted by the base station is changed. However, if the interference wave strength estimation signal, field strength estimation signal, multipath estimation signal, and Doppler frequency estimation signal themselves are output as radio wave propagation environment estimation signals, determination of the modulation method is carried out by the base station.

A distortion estimation section 3210 estimates distortion produced due to the transmission path based on the serial signal (a pilot symbol, for example) output from the parallel-to-serial conversion section 3204, and outputs a distortion estimation signal to a correction section 3211. The correction section 3211 multiplies the distortion estimation signal output from the distortion estimation section 3210 by a value that varies the amplitude of pilot symbols 3002 in the IQ plane according to the modulation method of data symbols 3001 in FIG. 30 as a correction value, and outputs the corrected distortion estimation signal to a demodulation section 3212. The demodulation section 3212 demodulates the serial signal output from the parallel-to-serial conversion section 3204 based on the corrected distortion estimation signal output from the correction section 3211, and outputs a received digital signal.

Figure 34:
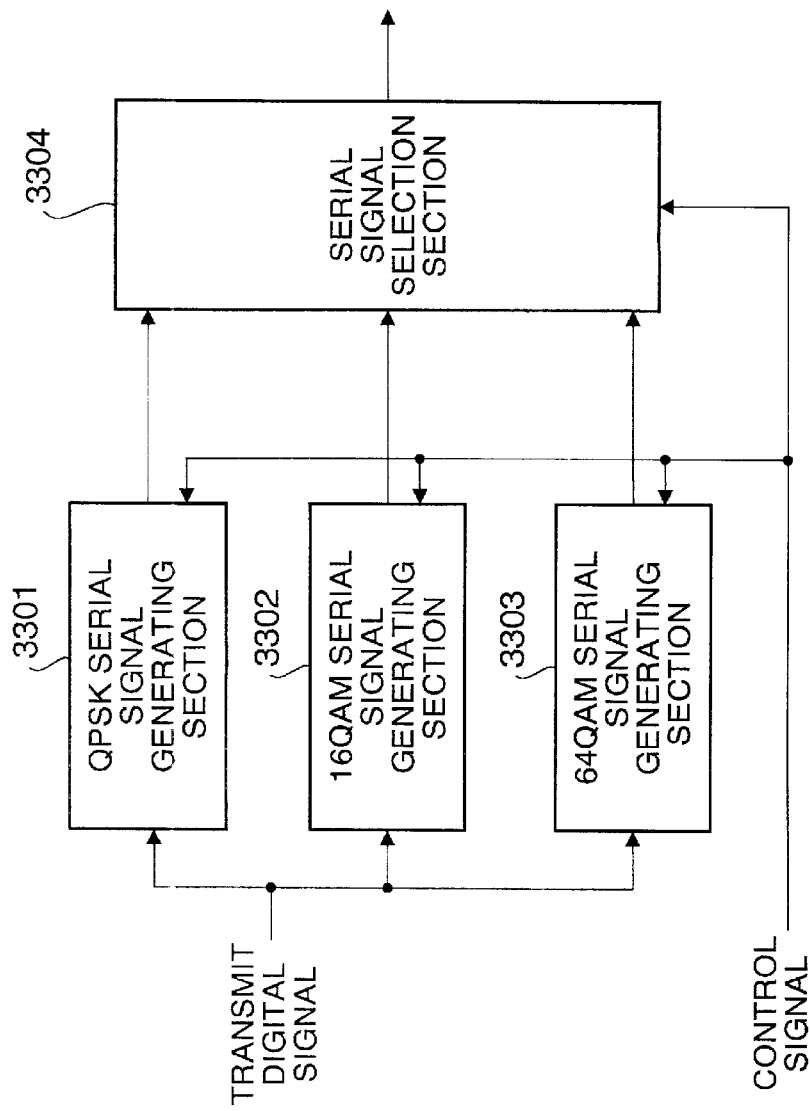
FIG. 34 is a block diagram showing the internal configuration of a modulation section according to Embodiment 6 of the present invention.

FIG. 34 shows the internal configuration of the modulation section 3101 in FIG. 32. In FIG. 34, in a QPSK serial signal generating section 3301, when modulation method information contained in a control signal among input transmit digital signals and control signals is QPSK, a serial signal is generated in accordance with the frame configuration in FIG. 31, and a QPSK serial signal is output to a serial signal selection section 3304.

In a 16QAM serial signal generating section 3302, when modulation method information contained in a control signal among input transmit digital signals and control signals is 16QAM, a serial signal is generated in accordance with the frame configuration in FIG. 31, and a 16QAM serial signal is output to the serial signal selection section 3304.

In a 64QAM serial signal generating section 3303, when modulation method information contained in a control signal among input transmit digital signals and control signals is 64QAM, a serial signal is generated in accordance with the frame configuration in FIG. 31, and a 64QAM serial signal is output to the serial signal selection section 3304.

The serial signal selection section 3304 has a QPSK serial signal, 16QAM serial signal, 64QAM serial signal, and control signal as input, selects the serial signal of the specified modulation method based on modulation method information contained in the control signal, and outputs this as the selected serial signal. The serial signal selected at this time corresponds to the serial signal output from the modulation section 3101 in FIG. 32.

As in Embodiment 1, the QPSK serial signal generating section 3301, 16QAM serial signal generating section 3302, and 64QAM serial signal generating section 3303 operate so that the respective average power of the respective transmit signals is fixed, and, in the transmission power amplification section 3106, pilot symbol signal point amplitudes are arranged in the in-phase-quadrature plane so that the operating range does not vary even if the modulation method is switched. Also, in the transmission power amplification section 3106, pilot symbol signal point amplitudes may be arranged in the IQ plane so that the reception sensitivity of the communicating party is made optimal within a range in which distortion does not arise.

Figure 35:
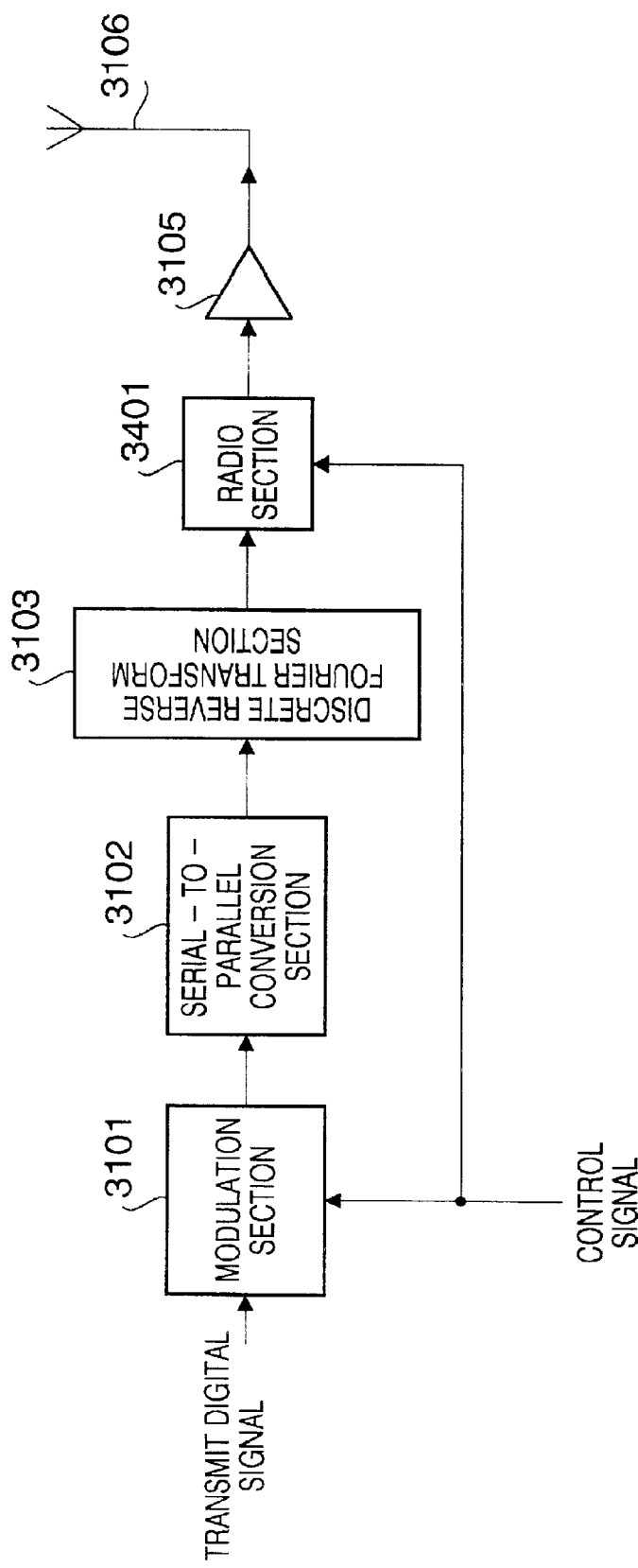
FIG. 35 is a block diagram showing the configuration of the transmitting apparatus of a base station according to Embodiment 6 of the present invention.

FIG. 35 shows the configuration of the transmitting apparatus of a base station according to this embodiment. FIG. 35 differs from FIG. 32 in that a control signal is input to the radio section 3401. The radio section 3401 has a function for performing adjustment so that the average transmission power of a transmit signal is the same with any modulation method based on modulation method information contained in the input control signal.

By means of the above, it is possible for the modes described in Embodiment 1, Embodiment 2, and Embodiment 5 also to be implemented with the OFDM method.

(Embodiment 7)

In Embodiment 7, a case is described in which, changing the standpoint from that of the method described in Embodiment 1, the focus is on improving the reception sensitivity characteristics of the receiving apparatus, and data transmission is performed with the maximum transmission output power made the same for each modulation method in a radio communication method in which adaptive modulation is carried out.

Figure 36:
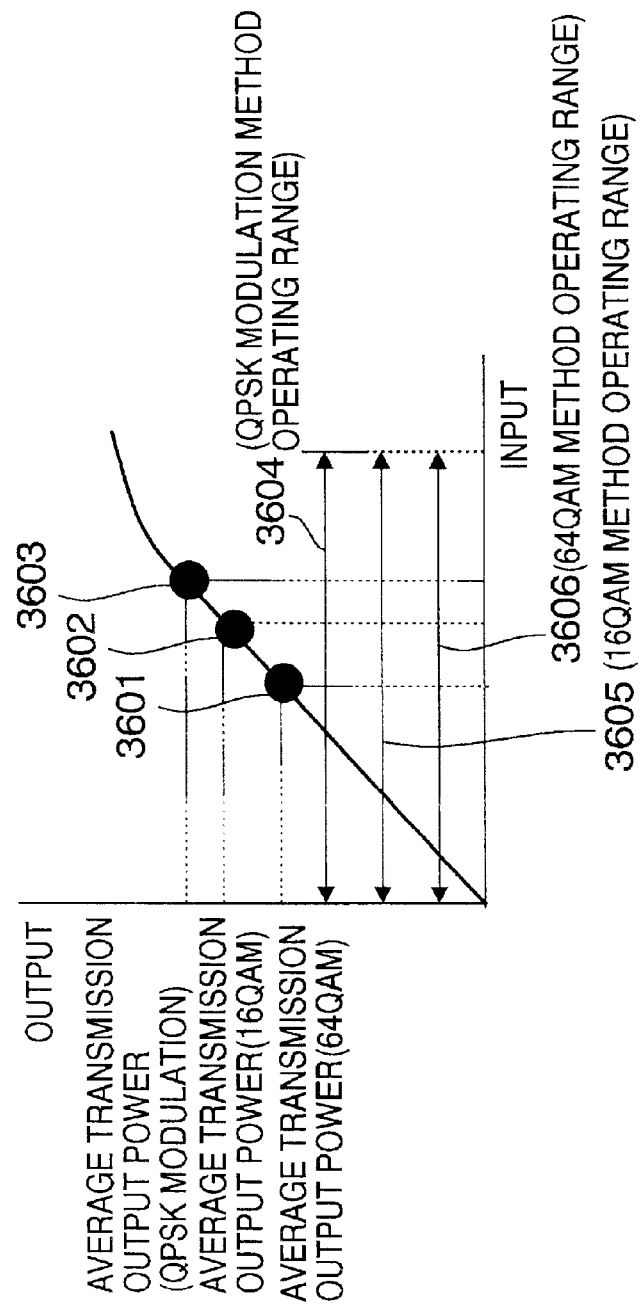
FIG. 36 is an input/output relationship diagram of a transmission power amplification section according to Embodiment 7 of the present invention.

The transmitting apparatus of this embodiment has the configuration shown in FIG. 3, and differs from Embodiment 1 in the way in which transmission power is amplified. Moreover, the receiving apparatus has the configuration shown in FIG. 13, and therefore descriptions of the respective configurations are omitted here. FIG. 36 is a graph showing the input/output relationship of a transmission power amplification section according to this embodiment. In FIG. 36, reference code 3601 indicates the 64QAM operation point, reference code 3602 indicates the 16QAM operation point, and reference code 3603 indicates the QPSK operation point, signifying that the average transmission output power differs for each modulation method. Further, reference code 3604 indicates the QPSK operating range, reference code 3605 indicates the 16QAM operating range, and reference code 3606 indicates the 64QAM operating range, the operating range being the same for each modulation method.

Using a transmission power amplifier that performs power amplification as described above makes it possible to improve the reception sensitivity characteristics of the receiving apparatus. Also, with a transmitting apparatus that has the configuration shown in FIG. 10, the transmitting apparatus can be made smaller than when using a transmission power amplifier as appropriate for each modulation method.

Next, a case will be described in which a service mode is implemented that is characterized by having a different service range for each modulation method within the service area of a base station equipped with the power amplifier described in this embodiment.

FIG. 37 is a conceptual diagram showing the range in which communication from a base station is possible for each modulation method. In FIG. 37, of the signals transmitted from the base station 3701, signals modulated using 64QAM can be communicated within the area whose boundary is indicated by reference code 3702, and this area is designated the 64QAM service area 3702. Similarly, of the signals transmitted from the base station 3701, signals modulated using 16QAM can be communicated within the area whose boundary is indicated by reference code 3703, and this area is designated the 16QAM service area 3703; and of the signals transmitted from the base station 3701, signals modulated using QPSK can be communicated within the area whose boundary is indicated by reference code 3704, and this area is designated the QPSK service area 3704.

The ability to divide the service area for each modulation method in this way derives from the fact that, as can be seen from FIG. 36, 64QAM has lower average transmission output power than the other modulation methods, incurs few transmission path errors in narrow-area communications, and is suited to high-speed communication. QPSK, on the other hand, has higher average transmission output power than the other modulation methods, and incurs few transmission path errors even in wide-area communications, making it suitable for low-speed data communication and voice communication.

By means of the above, it is possible to make the maximum transmission output power the same for each modulation method in a radio communication method whereby adaptive modulation is performed, and in addition, it is possible to implement a service mode characterized by having a different service area for each modulation method.

(Embodiment 8)

In Embodiment 8, a case is described in which the average transmission output power permitted in a radio communication system is stipulated when data transmission is performed with the maximum transmission output power made the same for each modulation method described in Embodiment 7.

When the maximum transmission output power of each modulation method is made the same, it may be that, for example, the average transmission output power for QPSK is 2 W, the average transmission output power for 16QAM is 1 W, and the average transmission output power for 64QAM is 0.5 W.

On the other hand, if the average transmission output power stipulated in a radio communication system is in the range from 0.25 W to 3.00 W, the average transmission output power of each modulation method will be within the stipulated average transmission output power range even if the maximum transmission output power of each modulation method is made the same.

However, if the average transmission output power stipulated in a radio communication system is in the range from 0.25 W to 1.50 W, when the maximum transmission output power of each modulation method is made the same, the average transmission output power for QPSK will be 2 W, and will no longer fall within the stipulated range.

In this case, the condition for keeping the QPSK average transmission output power within the stipulated range and enabling signals of each modulation method to be amplified by the transmission power amplification section is a value of 1.5 W.

When the average transmission output power in a radio communication system is stipulated in this way, this must be taken into consideration, and the maximum transmission output power for each modulation method will not necessary be the same at this time.

As described above, according to the present invention, in a radio communication method whereby adaptive modulation is performed, the reception sensitivity characteristics of a receiving apparatus can be improved by maintaining the average transmission power of a transmitting apparatus at a fixed level, and arranging pilot symbol signal points in the IQ plane so that the reception sensitivity characteristics of the receiving apparatus are made optimal.

The present invention is not limited to the above described embodiments, and various variations and modifications may be possible without departing from the scope of the present invention.

This application is based on Japanese Patent Application No. 2000-320624 filed on Oct. 20, 2000, Japanese Patent Application No. 2000-337114 filed on Nov. 6, 2000, Japanese Patent Application No. 2001-51829 filed on Feb. 27, 2001, and Japanese Patent Application No. 2001-245052 filed on Aug. 10, 2001, entire content of which is expressly incorporated by reference herein.

What is claimed is:

1. A radio communication apparatus comprising:
   a receiver that receives modulation signals generated by switching modulation methods according to radio wave propagation environment;
   a distortion estimator that estimates distortion due to transmission path and outputs a distortion estimation signal; and
   a corrector that calculates a correction value from a ratio of a signal point amplitude of a known symbol for a modulation method of a signal received by the receiver and a maximum signal point amplitude for said modulation method, and corrects said distortion estimation signal by multiplying said distortion estimation signal by said correction value.

2. The radio communication apparatus according to claim 1, wherein the corrector calculates a correction value from a ratio of a signal point amplitude of a known symbol in each modulation method greater than a maximum signal point amplitude of said each modulation method and said maximum signal point amplitude of said each modulation method.

* * * * *